(12) United States Patent
Dutta et al.

(10) Patent No.: US 11,984,874 B2
(45) Date of Patent: May 14, 2024

(54) SURFACE ACOUSTIC WAVE (SAW) FILTER PACKAGES EMPLOYING AN ENHANCED THERMALLY CONDUCTIVE CAVITY FRAME FOR HEAT DISSIPATION, AND RELATED FABRICATION METHODS

(71) Applicant: QUALCOMM Incorporated, San Diego, CA (US)

(72) Inventors: Ranadeep Dutta, Del Mar, CA (US); Jonghae Kim, San Diego, CA (US); Je-Hsiung Lan, San Diego, CA (US)

(73) Assignee: QUALCOMM INCORPORATED, San Diego, CA (US)

( * ) Notice: Subject to any disclaimer, the term of this patent is extended or adjusted under 35 U.S.C. 154(b) by 366 days.

(21) Appl. No.: 17/409,282

(22) Filed: Aug. 23, 2021

(65) Prior Publication Data

US 2023/0054636 A1 Feb. 23, 2023

(51) Int. Cl.
*H03H 9/64* (2006.01)
*H03H 3/10* (2006.01)
(Continued)

(52) U.S. Cl.
CPC ............ *H03H 9/6406* (2013.01); *H03H 3/10* (2013.01); *H03H 9/02834* (2013.01); *H03H 9/059* (2013.01); *H03H 9/1071* (2013.01)

(58) Field of Classification Search
None
See application file for complete search history.

(56) References Cited

U.S. PATENT DOCUMENTS 11,764,750 B2 * 9/2023 Hou .................... H03H 9/13
310/341
2004/0232802 A1 11/2004 Koshido
(Continued)

OTHER PUBLICATIONS

Chen Z., et al., "Development and Reliability Study of 3-D Wafer Level Packaging for SAW Filter Using Thin Film Capping", IEEE Transactions on Components, Packaging and Manufacturing Technology, vol. 11, No. 7, Jun. 2021, pp. 1047-1054, XP011867245, [retrieved on Jul. 19, 2021] figures 1,2.
(Continued)

*Primary Examiner* — Kenneth B Wells
(74) *Attorney, Agent, or Firm* — Withrow & Terranova, PLLC

(57) ABSTRACT

Surface acoustic wave (SAW) filter packages employing an enhanced thermally conductive cavity frame for heat dissipation, and related fabrication methods are disclosed. The SAW filter package also includes a cavity frame comprising a perimeter structure and a cavity inside the perimeter structure coupled to a substrate of a piezoelectric material that contains interdigital transducers (IDTs). A cap substrate is disposed on the perimeter structure of the cavity frame to enclose an air cavity inside the perimeter structure between a substrate and the cap substrate. In exemplary aspects, to effectively dissipate heat generated in the SAW filter package to maintain the desired performance of the SAW filter, the cavity frame is comprised of a material that has an enhanced thermal conductivity. The heat generated in the SAW filter package can more effectively be dissipated, particularly at edges and corners of the cavity frame where hot spots can particularly occur.

33 Claims, 17 Drawing Sheets

(51) Int. Cl.
H03H 9/02 (2006.01)
H03H 9/05 (2006.01)
H03H 9/10 (2006.01)

(56) References Cited

U.S. PATENT DOCUMENTS

| | | |
|---|---|---|
| 2009/0224851 A1 | 9/2009 | Feiertag et al. |
| 2014/0354114 A1 | 12/2014 | Moriya et al. |
| 2021/0159877 A1 | 5/2021 | Fukuhara et al. |
| 2022/0416149 A1* | 12/2022 | Hou ............... H03H 9/176 |
| 2023/0223913 A1* | 7/2023 | Yu ................ H03H 9/568 |
| | | 327/552 |

OTHER PUBLICATIONS

Chen Z., et al., "Development of 3D Wafer Level Package for SAW Filters Using Thin Film Lamination", IEEE International Conference on Electronic Packaging Technology, 2020, pp. 1-5, XP033830662, [retrieved on Sep. 21, 2020] section II.A, figure 1.
International Search Report and Written Opinion for International Patent Application No. PCT/US2022/073354, dated Oct. 19, 2022, 19 pages.

* cited by examiner

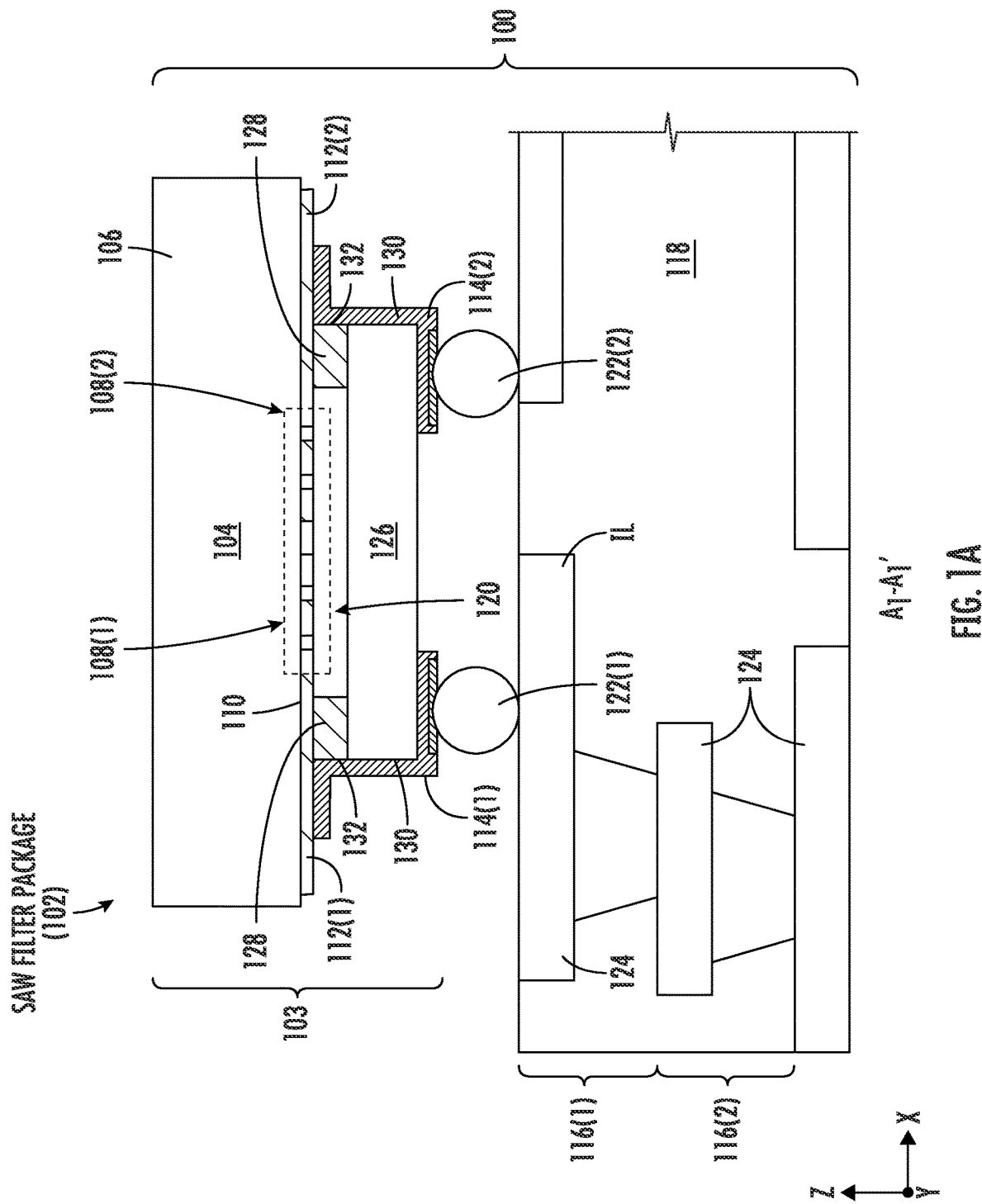

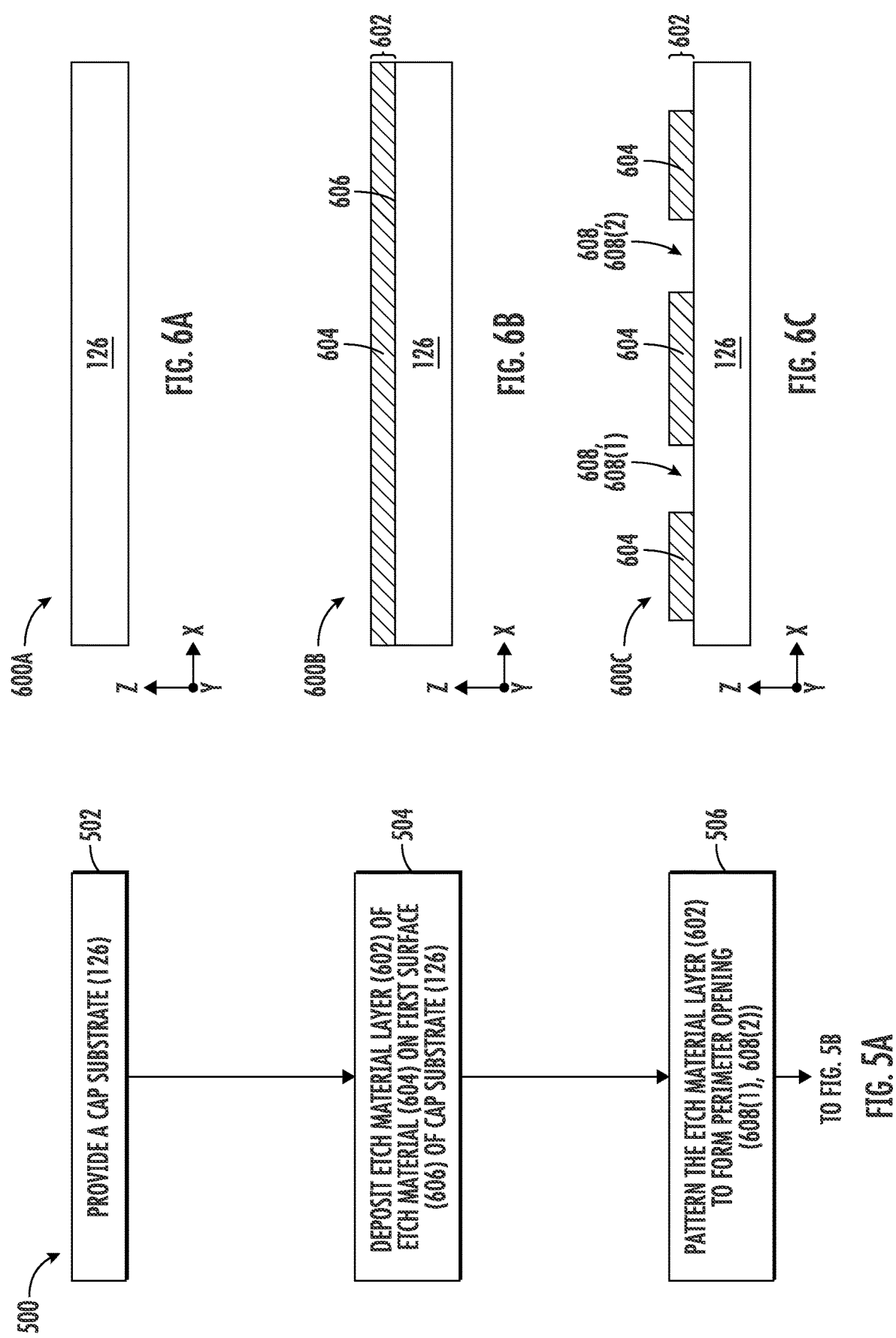

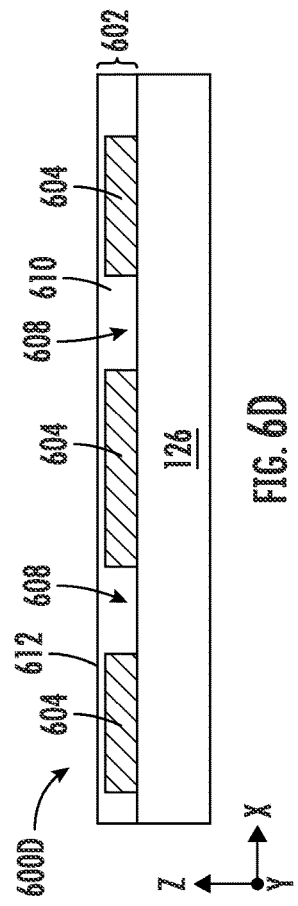
FIG. 6D
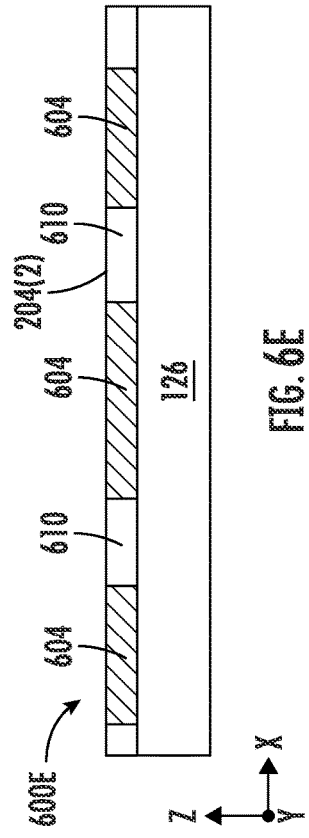
FIG. 6E
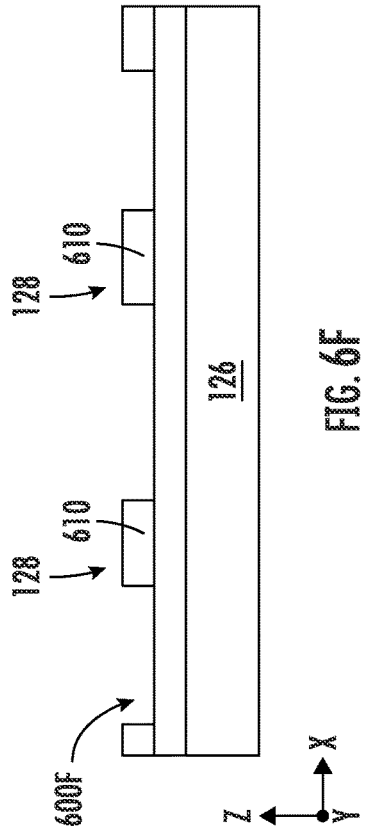
FIG. 6F
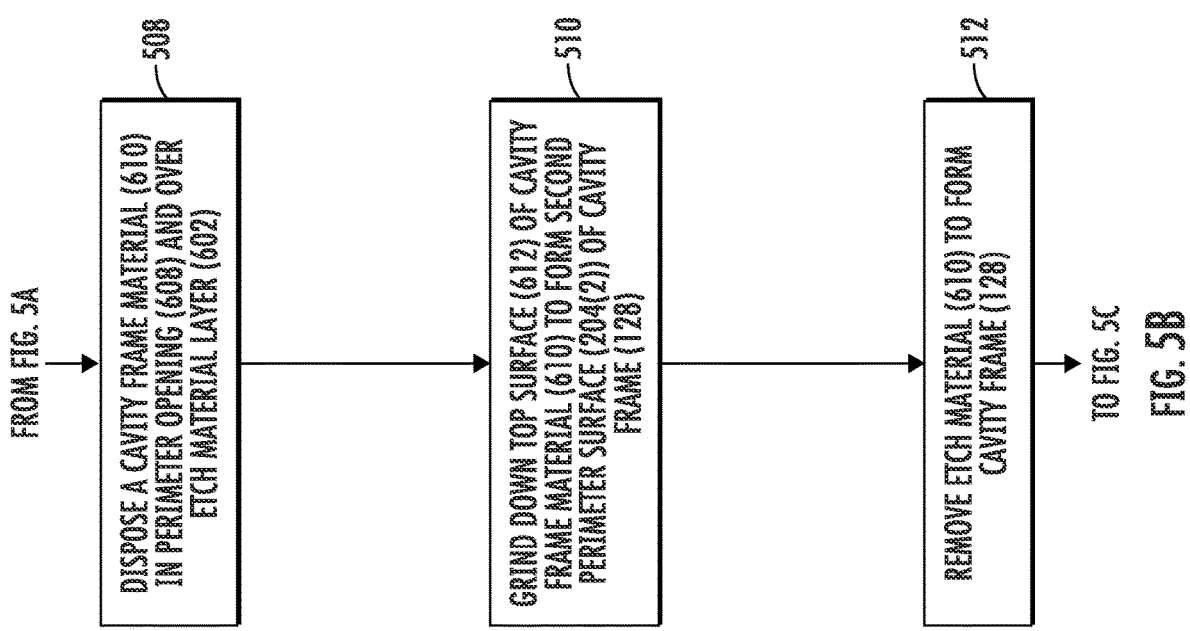

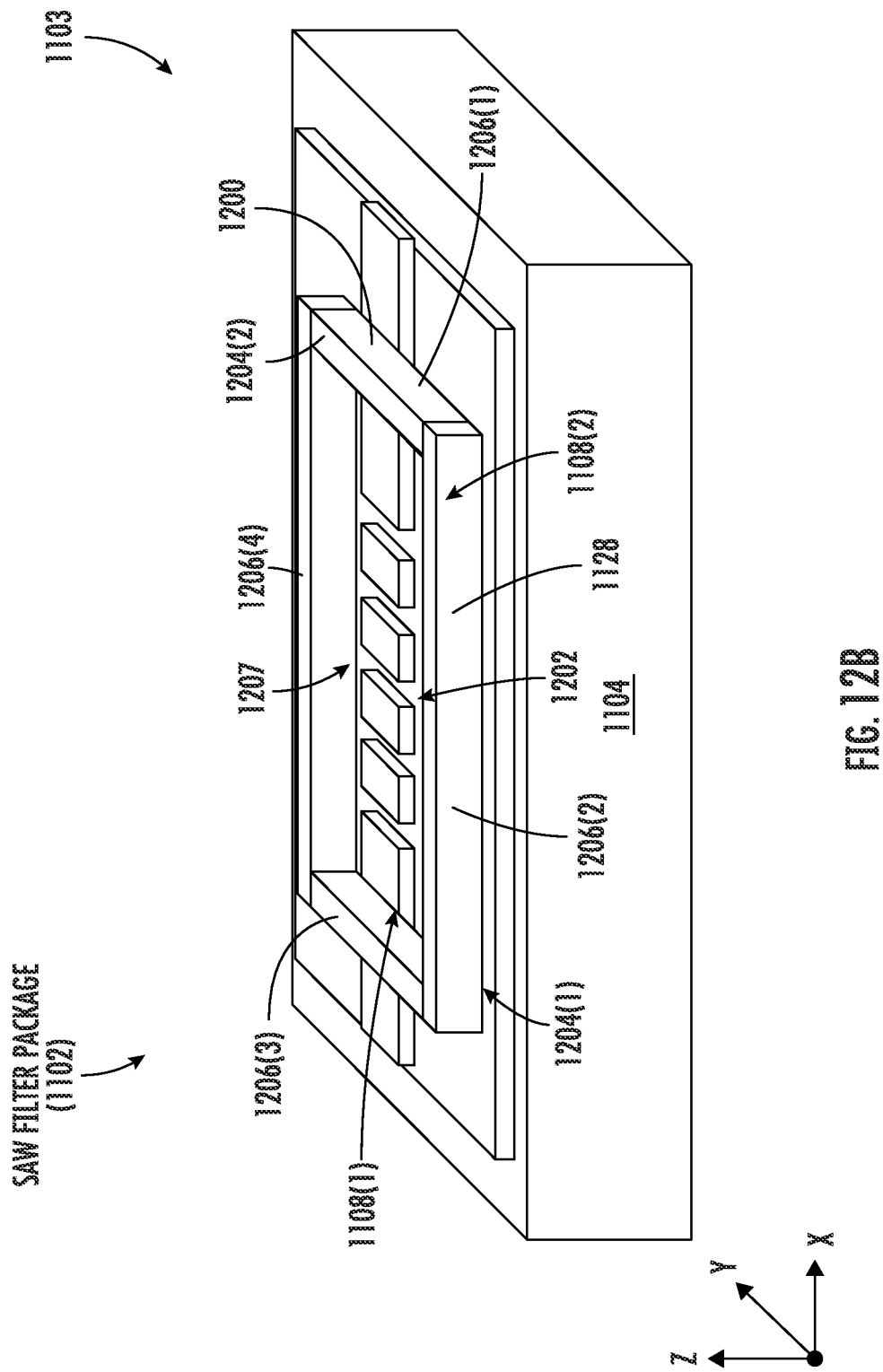

SURFACE ACOUSTIC WAVE (SAW) FILTER PACKAGES EMPLOYING AN ENHANCED THERMALLY CONDUCTIVE CAVITY FRAME FOR HEAT DISSIPATION, AND RELATED FABRICATION METHODS

BACKGROUND

I. Field of the Disclosure

The field of the disclosure relates to surface acoustic wave (SAW) filters, and more particularly to SAW filter packages.

II. Background

Mobile wireless device manufacturers pack ever-increasing capabilities into hand-held sized packages. Increasing capability means that more electronic components must fit into the package. This trend drives a size reduction of electronic components used for radio-frequency (RF) signal processing. A challenge to miniaturizing electronic components is finding a way to provide the same function in a physically smaller electronic device. Another challenge to miniaturizing electronic components is created by a physically smaller device dissipating the same or similar amount of power, leading to the same or similar heat generation. Heat generated within a physically smaller device leads to higher operating temperatures in a smaller package, which increases the potential to affect device performance and its life span. Thus, there is a desire to find ways for more effectively dissipating heat when reducing the device size.

One device that has been employed in RF signal processing circuits provided in smaller electronic devices for signal filtering is a surface acoustic wave (SAW) filter. The SAW filter removes or reduces the energy in one or more bands of frequencies from an input analog signal. A SAW filter filters frequencies by transforming electromagnetic wave propagation into mechanical wave propagation on the surface of a substrate material. SAW filters can be implemented in die-sized SAW packages (DSSPs) for use in a mobile device, as an example. SAW DSSP technology has been significant in the reduction of mobile device sizes. However, there is continued demand for further size reduction of SAW DSSP as well as effectively dissipating heat when reducing such devices.

SUMMARY OF THE DISCLOSURE

Aspects disclosed herein include surface acoustic wave (SAW) filter packages employing an enhanced thermally conductive cavity frame for heat dissipation. Related fabrication methods are also disclosed. The SAW filter package includes a functional substrate ("substrate") that comprises a piezoelectric material and has a first surface with a first and second interdigital transducer (IDT) disposed therein to provide a SAW filter circuit. The SAW filter package also includes a cavity frame comprising a frame perimeter structure and a cavity inside the frame perimeter structure coupled to the substrate. A cap substrate is disposed on the frame perimeter structure of the cavity frame to enclose an air cavity inside the frame perimeter structure between the substrate and the cap substrate. In exemplary aspects, to effectively dissipate heat generated in the SAW filter package to maintain the desired performance of the SAW filter, the cavity frame is comprised of a material that has an enhanced thermally conductivity. For example, the cavity frame may be comprised of a diamond material to provide a diamond cavity frame. As another example, the cavity frame may be comprised of a material that has a thermal conductivity of at least five (5) Watts (W) per meter (m)-Kelvin (W/m-K). In this manner, heat generated in the SAW filter package can more effectively be dissipated, particularly at edges and corners of the cavity frame where hot spots can particularly occur.

Also, in other exemplary aspects, the side walls of the cavity frame are aligned or co-planar to the side walls of the cap substrate in a vertical direction, as opposed to the side walls of the cavity frame extending further outward from the side walls of the cap substrate forming a shoulder area or staggered frame edge. In this manner, the area of the SAW filter is reduced in the horizontal direction to reduce the area of the SAW filter package, which may be desired if the SAW filter package is employed in devices with reduced available area for circuit packages. Aligning the side walls of the cavity frame and cap substrate can also reduce metal interconnect path lengths between metal interconnects (e.g., solder bumps) on the cap substrate and metal interconnects on the substrate. In certain other exemplary aspects, to achieve co-planarity between the cap substrate and cavity frame side walls, the cavity frame is patterned and formed on the cap substrate as opposed to the substrate. This allows the cavity frame patterned on the cap substrate to be diced in a vertical direction in a dicing step such that their respective side walls are co-planar in the vertical direction. This can avoid or reduce misalignment between the cap substrate and cavity frame that may otherwise occur if the cavity frame is formed on the substrate, wherein the cap substrate must then be aligned and coupled to the cavity frame that has a greater width to provide an alignment tolerance to the cap substrate. Further, forming the cavity frame on the cap substrate may also be advantageous if the thermal budget for deposition of the cavity frame material exceeds the thermal budget of the substrate. This can avoid diffusion of the metal interconnects in the metallization layers of the substrate that could adversely affect performance of the SAW filter package. The cap substrate may be formed from a material that does not include metallization structures and thus can tolerate the increased thermal budget for the cavity frame material deposition.

In this regard, in one exemplary aspect, a SAW filter package is disclosed. The SAW filter package includes a substrate including a piezoelectric material and having a first surface. The SAW filter package also includes a cap substrate. The SAW filter package also includes a diamond cavity frame disposed between the substrate and the cap substrate that forms a cavity between the cap substrate and the first surface of the substrate. The SAW filter package also includes a first IDT on the first surface of the substrate inside the cavity. The SAW filter package also includes a second IDT on the first surface of the substrate inside the cavity.

In another exemplary aspect, a SAW filter package is disclosed. The SAW filter package includes a substrate including a piezoelectric material and having a first surface. The SAW filter package also includes a cap substrate. The SAW filter package also includes a cavity frame having a thermal conductivity of at least five (5) Watts (W) per meter (m)-Kelvin (W/m-K). The cavity frame is disposed between the substrate and the cap substrate that forms a cavity between the cap substrate and the first surface of the substrate. The SAW filter package also includes a first IDT on the first surface of the substrate inside the cavity. The SAW filter package also includes a second IDT on the first surface of the substrate inside the cavity.

In another exemplary aspect, a method of fabricating a SAW filter package is disclosed. The method includes providing a cap substrate comprising a first surface. The method also includes coupling a first surface of a cavity frame to the cap substrate. The cavity frame has a thermal conductivity of at least 5 W/m-K. The method also includes providing a substrate including a piezoelectric material, a first surface, a first IDT on the first surface of the substrate, and a second IDT on the first surface of the substrate. The method also includes coupling a second surface of the cavity frame to the first surface of the substrate thereby forming a cavity between the cap substrate and the first surface of the substrate and enclosing the first IDT and the second IDT.

BRIEF DESCRIPTION OF THE FIGURES

FIG. 1A is a cross-sectional side view of an exemplary circuit package that includes a surface acoustic wave (SAW) filter package employing an enhanced thermally conductive cavity frame for heat dissipation and a co-planar cap substrate and cavity frame for die size reduction and shorter metal interconnect paths;

FIGS. 5A-5C are a flowchart illustrating another exemplary process for fabricating an enhanced thermally conductive cavity frame co-planar with a cap substrate for a SAW filter package for heat dissipation, including, but not limited to, the cavity frame and cap substrate in the SAW filter package in FIGS. 1A-2C;

FIGS. 6A-6I illustrate exemplary fabrication stages during fabrication of an enhanced thermally conductive cavity frame co-planar with a cap substrate for a SAW filter package for heat dissipation, including, but not limited to, the cavity frame and cap substrate in the SAW filter package in FIGS. 1A-2C, according to the exemplary fabrication process in FIGS. 5A-5C;

FIG. 12B is a cross-sectional side view of the SAW filter package in FIG. 11 employing an enhanced thermally conductive cavity frame for heat dissipation;

DETAILED DESCRIPTION

Figure 1B:
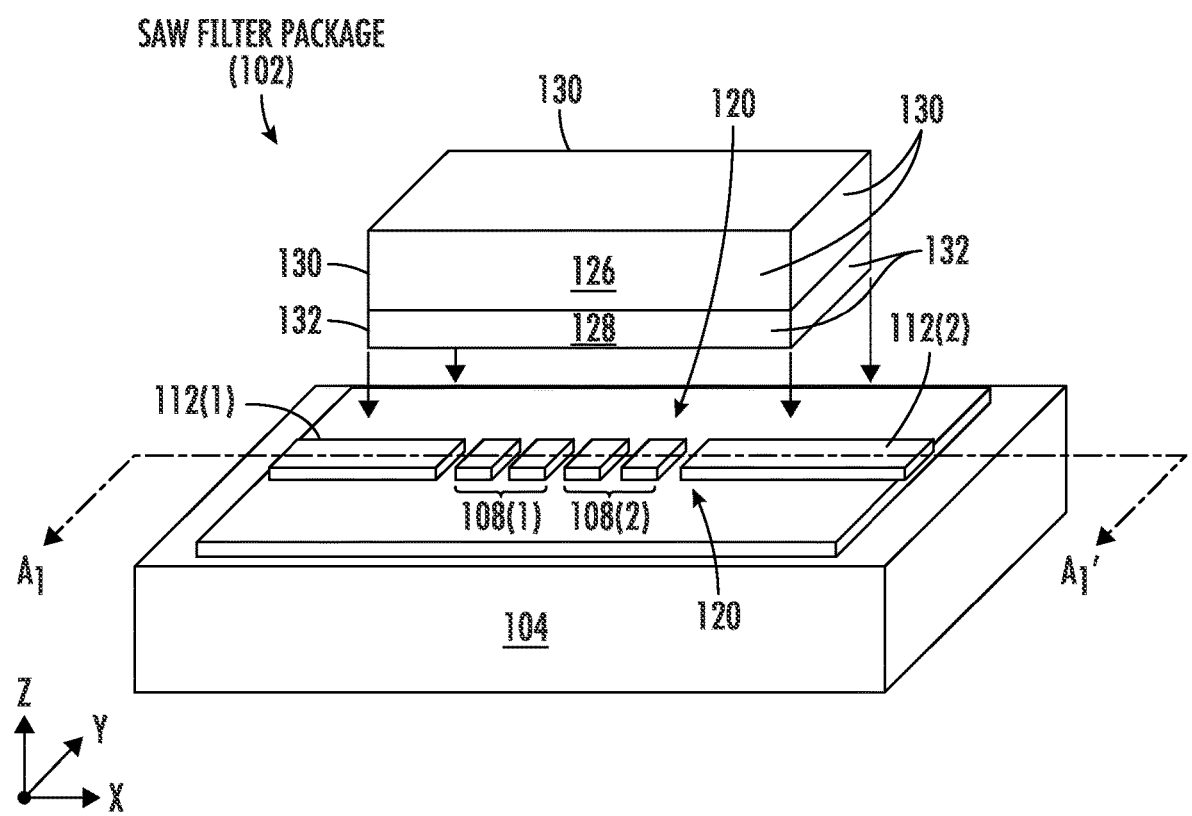
FIG. 1B is a perspective side view of the SAW filter package in the circuit package in FIG. 1A employing an enhanced thermally conductive cavity frame for heat dissipation and a co-planar cap substrate and cavity frame for die size reduction and shorter metal interconnect paths.

With reference now to the drawing figures, several exemplary aspects of the present disclosure are described. The word "exemplary" is used herein to mean "serving as an example, instance, or illustration." Any aspect described herein as "exemplary" is not necessarily to be construed as preferred or advantageous over other aspects.

Aspects disclosed herein include surface acoustic wave (SAW) filter packages employing an enhanced thermally conductive cavity frame for heat dissipation. Related fabrication methods are also disclosed. The SAW filter package includes a functional substrate ("substrate") that comprises a piezoelectric material and has a first surface with a first and second interdigital transducer (IDT) disposed therein to provide a SAW filter circuit. The SAW filter package also includes a cavity frame comprising a frame perimeter structure and a cavity inside the frame perimeter structure coupled to the substrate. A cap substrate is disposed on the frame perimeter structure of the cavity frame to enclose an air cavity inside the frame perimeter structure between the substrate and the cap substrate. In exemplary aspects, to effectively dissipate heat generated in the SAW filter package to maintain the desired performance of the SAW filter, the cavity frame is comprised of a material that has an enhanced thermally conductivity. For example, the cavity frame may be comprised of a diamond material to provide a diamond cavity frame. As another example, the cavity frame may be comprised of a material that has a thermal conductivity of at least five (5) Watts (W) per meter (m)-Kelvin (W/m-K). In this manner, heat generated in the SAW filter package can more effectively be dissipated, particularly at edges and corners of the cavity frame where hot spots can particularly occur.

Also, in other exemplary aspects, the side walls of the cavity frame are aligned or co-planar to the side walls of the cap substrate in a vertical direction, as opposed to the side walls of the cavity frame extending further outward from the side walls of the cap substrate forming a shoulder area or staggered frame edge. In this manner, the area of the SAW filter is reduced in the horizontal direction to reduce the area of the SAW filter package, which may be desired if the SAW filter package is employed in devices with reduced available area for circuit packages. Aligning the side walls of the cavity frame and cap substrate can also reduce metal interconnect path lengths between metal interconnects (e.g., solder bumps) on the cap substrate and metal interconnects on the substrate. In certain other exemplary aspects, to achieve co-planarity between the cap substrate and cavity frame side walls, the cavity frame is patterned and formed on the cap substrate as opposed to the substrate. This allows the cavity frame patterned on the cap substrate to be diced in a vertical direction in a dicing step such that their respective side walls are co-planar in the vertical direction. This can avoid or reduce misalignment between the cap substrate and cavity frame that may otherwise occur if the cavity frame is formed on the substrate, wherein the cap substrate must then be aligned and coupled to the cavity frame that has a greater width to provide an alignment tolerance to the cap substrate. Further, forming the cavity frame on the cap substrate may also be advantageous if the thermal budget for deposition of the cavity frame material exceeds the thermal budget of the substrate. This can avoid diffusion of the metal interconnects in the metallization layers of the substrate that could adversely affect performance of the SAW filter package. The cap substrate may be formed from a material that does not include metallization structures and thus can tolerate the increased thermal budget for the cavity frame material deposition.

In this regard, FIG. 1A is a cross-sectional side view of an exemplary circuit package 100 that includes a SAW filter package 102 that provides a SAW filter circuit 103. The SAW filter package in FIG. 1A is shown along a cross-section line A1-A1' in FIG. 1B. The SAW filter package 102 is configured to block certain frequency ranges of an input radio-frequency (RF) signal. For example, the circuit package 100 may be included in another integrated circuit (IC) package that includes RF transmission/reception circuitry and antennas where the SAW filter package 102 is employed to filter transmitted and/or received RF signals. The SAW filter package 102 includes a substrate 104 that is made from a piezoelectric material 106 in this example. A first interdigital transducer (IDT) 108(1) is disposed on a first surface 110 of the substrate 104 as an input circuit. A second IDT 108(2) is also disposed on the first surface 110 of the substrate 104 adjacent to the first IDT 108(1) as an output circuit. The first IDT 108(1) is configured to receive a RF signal through a first metal interconnect 112(1) coupled to a first metal conductor 114(1). The first metal conductor 114(1) is coupled through the metal interconnect 122(2) (e.g., solder bumps, solder balls) on the cap substrate 126, to metal interconnects 124 (e.g., metal lines, metal traces, vertical interconnect accesses (vias)) in metallization layers 116(1), 116(2) in a package substrate 118 to a signal source. The first IDT 108(1) is configured to convert the received electrical RF signal into an acoustic wave that is emitted in a cavity 120 formed between the substrate 104 and the cap substrate 126. In this example, the cavity 120 is an air cavity. The second IDT 108(2) is configured to receive a filtered acoustic wave of the emitted acoustic wave emitted by the first IDT 108(1) and convert filtered acoustic wave into a filtered RF signal. The filtered RF signal is coupled to a second metal interconnect 112(2) coupled to a second metal conductor 114(2). The second metal conductor 114(2) is coupled through a metal interconnect 122(2) (e.g., solder bumps, solder balls) on the cap substrate 126, to the metal interconnects 124 in the metallization layers 116(1), 116(2) in the package substrate 118 to another circuit to receive the filtered RF signal.

To form the cavity 120 in the SAW filter package 102 in FIG. 1A, the cap substrate 126 is disposed on a cavity frame 128 that is disposed on the substrate 104. The cavity frame 128 provides a stand-off between the cap substrate 126 and the substrate 104. The cap substrate 126 is a substrate of material that is used to form the cavity 120. The cap substrate 126 is disposed on the frame perimeter structure of the cavity frame 128 to enclose the cavity 120 inside the frame perimeter structure between the substrate 104 and the cap substrate 126. Heat is generated inside the cavity 120 as a result of the operation of the SAW filter circuit 103. Excessive heat that is not effectively dissipated can increase the temperature of the SAW filter circuit 103 and negatively affect its filtering performance. The SAW filter circuit 103 will shift its blocking frequencies upwards at lower temperatures and downwards at higher temperatures in a linear fashion. Thus, it is important to effectively dissipate heat generated in the SAW filter package 102 to maintain the desired performance of the SAW filter circuit 103. In this regard, as discussed in more detail below, in this example, the cavity frame 128 is comprised of a material that has an enhanced thermal conductivity, as opposed to for example, a polymer material that is not a good thermal conductor. For example, the cavity frame 128 may be comprised of a diamond material to provide a diamond cavity frame. As another example, the cavity frame 128 may be comprised of a material that has a thermal conductivity of at least five (5) Watts (W) per meter (m)-Kelvin (W/m-K). A diamond cavity frame may have a thermal conductivity between and including 600-2,000 W/m-K. In this manner, heat generated in the SAW filter package 102 can more effectively be dissipated, particularly at edges and corners of the cavity frame 128 where hot spots can particularly occur.

Also, as discussed in more detail below, in this example, the SAW filter package 102 employs the cap substrate 126 that has side walls 130 that are co-planar with side walls 132 of the cavity frame 128 in a vertical direction in the Z-axis direction. This is also shown in the perspective side view of the SAW filter package 102 in FIG. 1B. This is opposed to the side walls 130 of the cap substrate 126 being staggered in the horizontal direction in the Y-axis direction with the side walls 132 of the cavity frame 128. This can facilitate die size reduction of the SAW filter package 102 in the X-axis direction and also shorter metal interconnect paths of the metal conductors 114(1), 114(2). Aligning the respective side walls 132, 130 of the cavity frame 128 and the cap substrate 126 can also reduce metal conductor 114(1), 114(2) path lengths between respective metal interconnects 112(1), 112(2) on the substrate 104 and the respective metal interconnects 122(1), 122(2) on the cap substrate 126 and metal interconnects 112(1), 112(2) on the substrate 104. In certain other exemplary aspects, to achieve co-planarity between the side walls 130 of the cap substrate 126 and side walls 132 of the cavity frame 128, the cavity frame 128 can be patterned and formed on the cap substrate 126 first in a fabrication process of the SAW filter package 102, as shown in FIG. 1B. This is opposed to the cavity frame 128 being first formed on the substrate 104. This allows the cavity frame 128 patterned on the cap substrate 126 to be diced in a vertical direction (Z-axis direction) in a dicing step such that the respective side walls 130, 132 of the cap substrate 126 and cavity frame 128 are co-planar in the vertical direction. This can avoid or reduce misalignment between the cap substrate 126 and cavity frame 128 that may otherwise occur if the cavity frame 128 is first formed on the substrate 104. The latter scenario may require the cavity frame 128 to have a greater width in the horizontal direction (X-axis direction) to support providing an alignment tolerance between the cavity frame 128 and the cap substrate 126. Further, forming the cavity frame 128 in the horizontal direction (X-axis direction) on the cap substrate 126 may also be advantageous if the thermal budget for deposition of the material of the cavity frame 128 exceeds the thermal budget of the substrate 104. For example, the heat generated by deposition of the cavity frame 128 may be diffused by the metal interconnects 124 in the metallization layers 116(1), 116(2) of the substrate 104 and could adversely affect performance of the circuit package 100. The cap substrate 126 may be formed from a material that does not include metallization structures and thus can tolerate the increased thermal budget of the material deposition of the cavity frame 128.

Figure 2A:
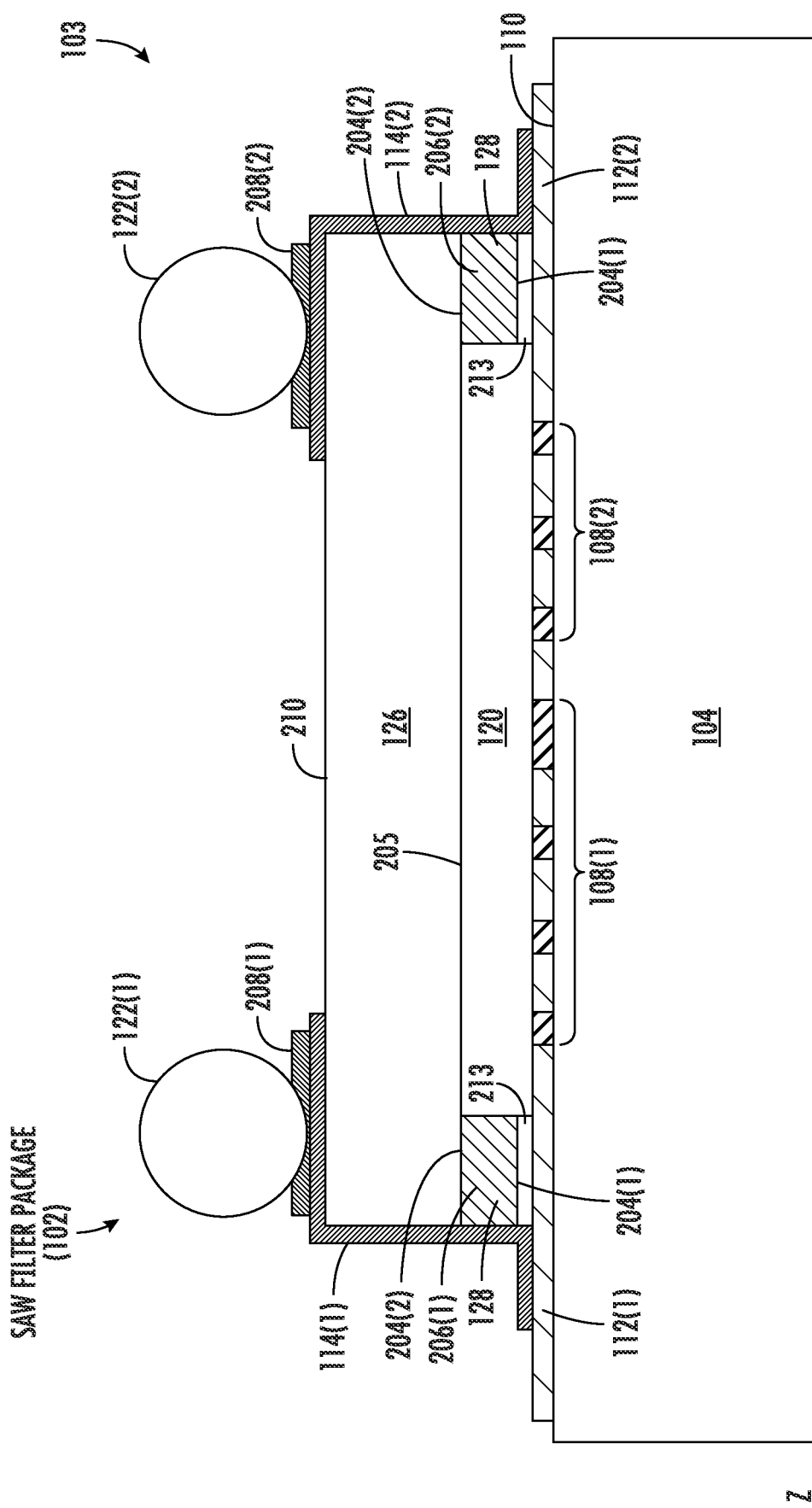
FIG. 2A is a cross-sectional side view of the SAW filter package in FIGS. 1A and 1B employing an enhanced thermally conductive cavity frame for heat dissipation and a co-planar cap substrate and cavity frame for die size reduction and shorter metal interconnect paths.
Figure 2B:
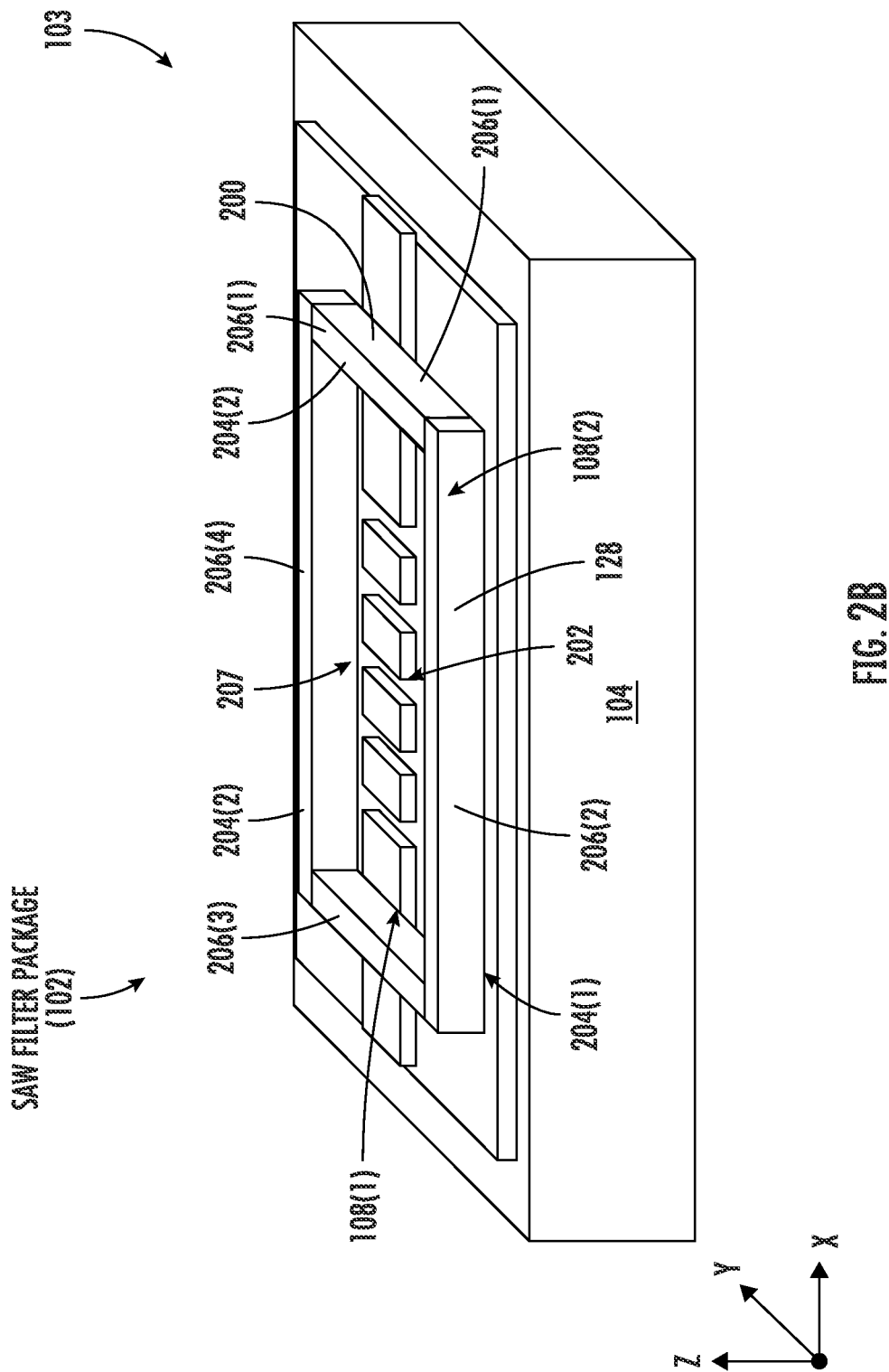
FIG. 2B is a perspective side view of the SAW filter package in FIG. 2A illustrating the frame perimeter structure of the cavity frame.

To provide more exemplary details of the SAW filter package 102 in FIGS. 1A and 1B employing an enhanced thermally conductive cavity frame 128 for heat dissipation and a co-planar cap substrate 126 and cavity frame 128 for die size reduction and shorter metal conductor 114(1), 114(2) paths lengths, FIGS. 2A and 2B are provided. FIG. 2A is cross-sectional side view of the SAW filter package 102 in FIGS. 1A and 1B. FIG. 2B is a perspective side view of the SAW filter package in FIG. 2A illustrating the frame perimeter structure of the cavity frame 128.

In this regard, as illustrated in FIG. 2A, the first and second IDTs 108(1), 108(2) are disposed on the first surface 110 of the substrate 104. The cavity frame 128 is disposed between the cap substrate 126 and the first surface 110 of the substrate 104. As shown in FIG. 2B, the cavity frame 128 includes a frame perimeter structure 200 that has an internal cavity 202 inside the frame perimeter structure 200. The internal cavity 202 will create the cavity 120 of the SAW filter package 102 as a result of the cavity frame 128 being disposed between the substrate 104 and the cap substrate 126. As discussed above, the cavity frame 128 can have a thermal conductivity of at least five (5) W/m-K to be more effective in dissipating heat generated in the SAW filter package 102. This is opposed to providing the cavity frame 128 of a polymer material that may have a thermal conductivity between 0.1-0.5 W/m-K. For example, the cavity frame 128 may be a diamond cavity frame made from a diamond material that has a thermal conductivity between and including 600-2,000 W/m-K. Providing the cavity frame 128 as a diamond cavity frame may also allow the material of the cap substrate 126 to be provided of a less expensive material, such as Silicon, because as discussed below, the cavity frame 128 is formed on the cap substrate 126 in an exemplary fabrication process. Diamond material can be disposed (e.g., through a deposition or sputtering process) and bonded to Silicon.

With continuing reference to FIG. 2A, the frame perimeter structure 200 includes a first perimeter surface 204(1) that is disposed on or adjacent to the first surface 110 of the substrate 104. Other examples of materials that can be used to form the cavity frame 128 and that have an enhanced thermal conductivity include aluminum oxide, silicon nitride, and/or sapphire, as non-limiting examples. The frame perimeter structure 200 also has a second perimeter surface 204(2) that is on the opposite side of the first perimeter surface 204(1) in a vertical axis direction (Z-axis direction). The second perimeter surface 204(2) of the frame perimeter structure 200 is disposed on or adjacent to a second surface 205 of the cap substrate 126. Metal interconnects 208(1), 208(2) are disposed on or adjacent to a first surface 210 of the cap substrate 126 to support the coupling of the metal interconnects 122(1), 122(2) to the metal conductors 114(1), 114(2). The first perimeter surface 204(1) of the frame perimeter structure 200 of the cavity frame 128 may be disposed on a pad 213 that is disposed on the first surface 110 of the substrate 104, to facilitate bonding of the material of the cavity frame 128 to the substrate 104. For example, the pad 213 may be an Aluminum pad that supports the bonding of a diamond cavity frame 128 to the substrate 104. The metal interconnects 112(1), 112(2) may also be an Aluminum material to promote such bonding.

In the example of the SAW filter package 102 shown in FIG. 2B, the frame perimeter structure 200 of the cavity frame 128 comprises a rectangular-shaped frame perimeter structure that includes four side structures 206(1)-206(4) disposed at right angles to each other. The four side structures 206(1)-204(4) of the frame perimeter structure 200 define an outer perimeter with a cavity 207 formed inside the frame perimeter structure 200. The second perimeter surface 204(2) of the frame perimeter structure 200 is formed by the bottom surfaces of the side structures 206(1)-206(4) in FIG. 2B. The second perimeter surface 204(2) of the frame perimeter structure 200 is formed by the top surfaces of the side structures 206(1)-206(4). To also assist in the performance of the SAW filter circuit provided by the SAW filter package 102, the cavity frame 128 may be provided that has a coefficient of thermal expansion (CTE) less than or equal to ten (10) parts per million (ppm) per degree Celsius (C) (ppm/deg C.). In this manner, the cavity frame 128 is less susceptive to expansion and contraction in response to temperature changes that may occur due to heat generated during operation of the SAW filter circuit 103. For example, a cavity frame 128 made from a diamond material may have a CTE less than or equal to one (1) ppm/deg C. Further, to reduce or minimize the electrical interference between the cavity frame 128 and the substrate 104 and the IDTs 108(1), 108(2) of the SAW filter package 102, the cavity frame 128 may be provided of a material that has an electrical resistivity greater than or equal to $1 \times 10^{10}$ Ohms centimeter (cm) (Ohms cm). For example, a cavity frame 128 made from a diamond material may have an electrical resistivity between and including $1 \times 10^{14}$ and $1 \times 10^{18}$ Ohms cm.

Figure 2C:
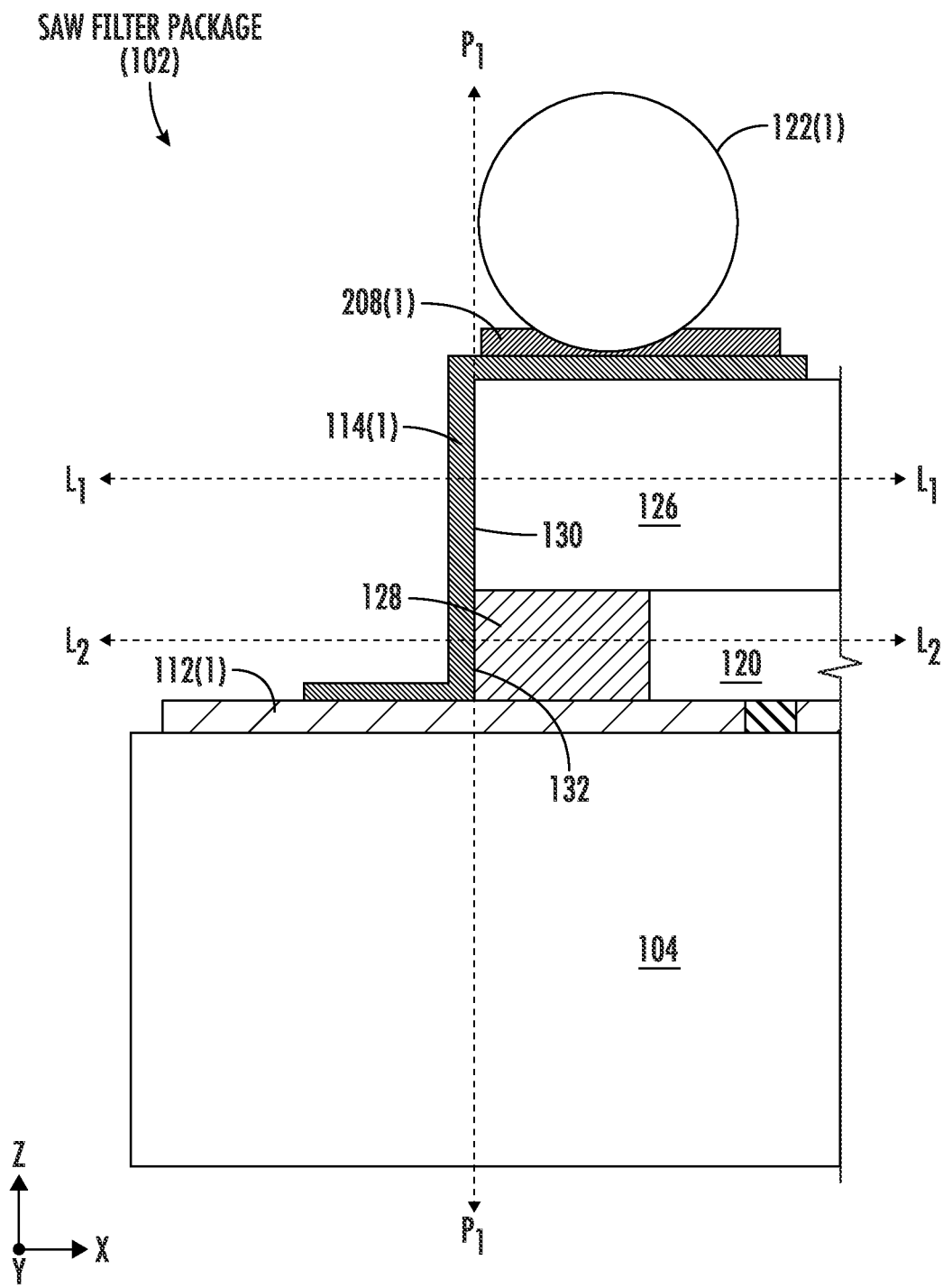
FIG. 2C is a close-up, cross-sectional side view of a section of the SAW filter package in FIG. 2A illustrating the co-planarity of the cap substrate and cavity frame.

FIG. 2C is a close-up, cross-sectional side view of a section of the SAW filter package 102 in FIG. 2A illustrating the co-planarity of the side walls 130, 132 of the respective cap substrate 126 and cavity frame 128. As shown therein, in this example, the side walls 130 of the cap substrate 126 and the side walls 132 of the cavity frame 128 are co-planar or substantially co-planar with each other along plane $P_1$. In other words, the side walls 130 of the cap substrate 126 and the respective side walls 132 extend out in the horizontal direction (X-axis direction) to the same point or approximately the same point. The side walls 130 of the cap substrate 126 and the side walls 132 of the cavity frame 128 extend along respective longitudinal axes $L_1$, $L_2$ that are parallel to each other to the same or substantially the same point in the horizontal direction or Y-axis of plane $P_1$ in the Y-X axes. Although FIG. 2C only shows a left side of the SAW filter package 102 in FIGS. 2A and 2B, the same features are also provided on the other sides of the SAW filter package 102. Providing planar or substantially coplanar side walls 130 of the cap substrate 126 and side walls 132 of the cavity frame 128 allows the metal conductor 114(1) to extend along the outside of the side walls 130 of the cap substrate 126 and the side walls 132 of the cavity frame 128 in the vertical or Z-axis direction without creating a jog or shoulder area that would be present if the side walls 130 of the cap substrate 126 and the side walls 132 of the cavity frame 128 were staggered in their extension in the horizontal direction. This can reduce the length of the metal conductors 114(1), 114(2) to decrease resistivity of the couplings between the IDTs 108(1), 108(2) and the respective metal conductors 114(1), 114(2) for improved performance. This is opposed to, for example, the SAW filter package 302 shown in the cross-sectional diagram in FIG. 3.

Figure 3:
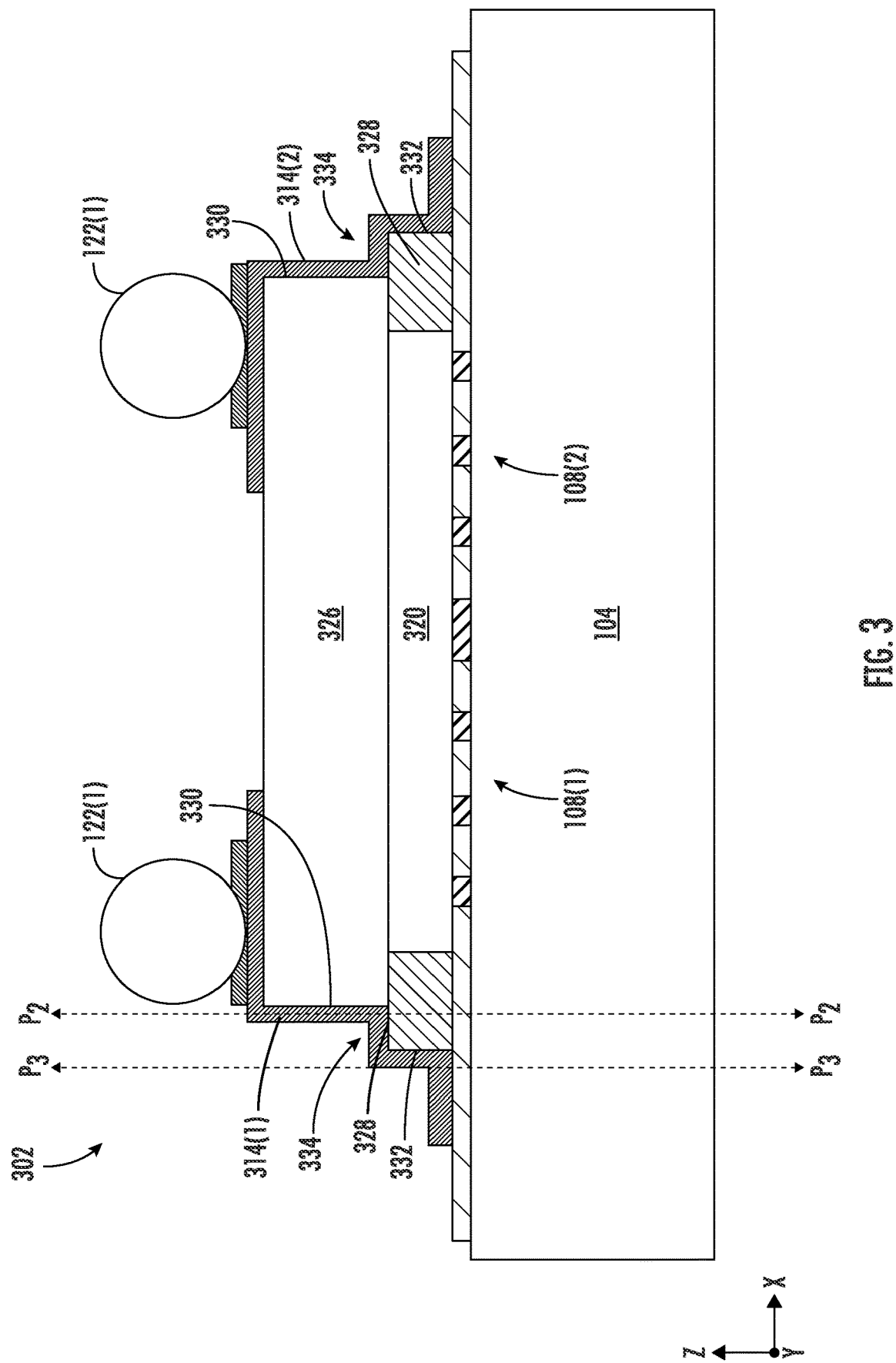
FIG. 3 is a cross-sectional side view of a SAW filter package that does not include an enhanced thermally conductive cavity frame for heat dissipation and a co-planar cap substrate and cavity frame for die size reduction and shorter metal interconnect paths.

As shown in FIG. 3, side walls 330 of a cap substrate 326 are staggered with side walls 332 of a cavity frame 328. Common elements between the SAW filter package 302 in FIG. 3 and the SAW filter package 102 in FIGS. 1-2C are shown with common element numbers. The side walls 330 of the cap substrate 326 extend in a horizontal direction (X-axis direction) to plane $P_2$ in the Y-X axes. The side walls 332 of the cavity frame 328 extend in a horizontal direction (X-axis direction) to plane $P_3$ in the Y-X axes that extends further away from the cavity 320 than the side walls 330. This creates a shoulder area 334 between the side walls 330, 332 that extends the path length of metal conductors 314(1), 314(2). The staggered cap substrate 326 and cavity frame 328 can also have the effect of extending the width of the SAW filter package 302 in the horizontal direction (X-axis direction) over the SAW filter package 102 in FIGS. 1A-2C. As discussed above and in more detail below, the staggering of the cap substrate 326 to the cavity frame 328 in this example can be a result of forming the cavity frame 328 on the substrate 104 first before the cap substrate 326 is disposed on the cavity frame 328. Disposing the cap substrate 326 on the substrate 104 may require the width of the cavity frame 328 to need to be expanded to provide a sufficient landing tolerance for the cap substrate 326.

Figure 4:
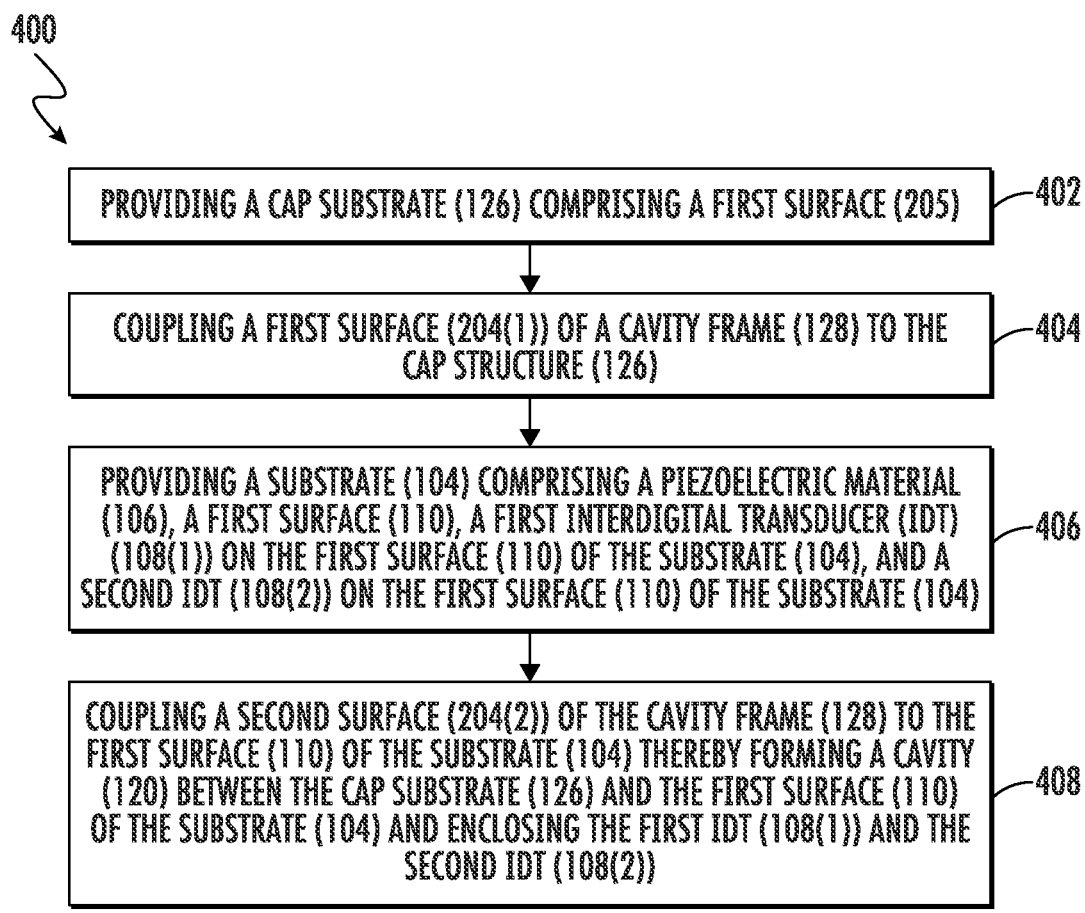
FIG. 4 is a flowchart illustrating an exemplary process of fabricating a SAW filter package employing an enhanced thermally conductive cavity frame for heat dissipation with a co-planar cap substrate and cavity frame, including, but not limited to, the SAW filter package in FIGS. 1A-2C.

FIG. 4 is a flowchart illustrating an exemplary process 400 of fabricating a SAW filter package employing an enhanced thermally conductive cavity frame for heat dissipation with a co-planar cap substrate and cavity frame, including, but not limited to, the SAW filter package 102 in FIGS. 1A-2C. The process 400 in FIG. 4 is discussed with reference to the exemplary SAW filter package 102 in FIGS. 1A-2C. In this regard, a fabrication step in the fabrication process 400 of fabricating the SAW filter package 102 in FIGS. 1A-2C can include providing a cap substrate 126 comprising a first surface 205 (block 402 in FIG. 4). A next step of the fabrication process 400 can include coupling a first perimeter surface 204(1) of a cavity frame 128 comprising a cavity 207 to the cap structure 126 (block 404 in FIG. 4). The cavity frame 128 may have a thermal conductivity of at least five (5) W/m-K to provide enhanced thermal conductivity to dissipate heat generated in the SAW filter package 102. The cavity frame 128 may be made from a highly thermally conductive material such as diamond, aluminum oxide, silicon nitride, and/or sapphire as non-limiting examples. A next step of the fabrication process 400 can include providing a substrate 104 comprising a piezoelectric material 106, a first surface 110, a first IDT 108(1) on the first surface 110 of the substrate 104, and a second IDT 108(2) on the first surface 110 of the substrate 104 (block 406 in FIG. 4). A next step of the fabrication process 400 can include coupling a second perimeter surface 204(2) of the cavity frame 128 to the first surface 110 of the substrate 104 thereby forming a cavity 120 between the cap substrate 126 and the first surface 110 of the substrate 104 and enclosing the first IDT 108(1) and the second IDT 108(2) (block 408 in FIG. 4).

Figure 5C:
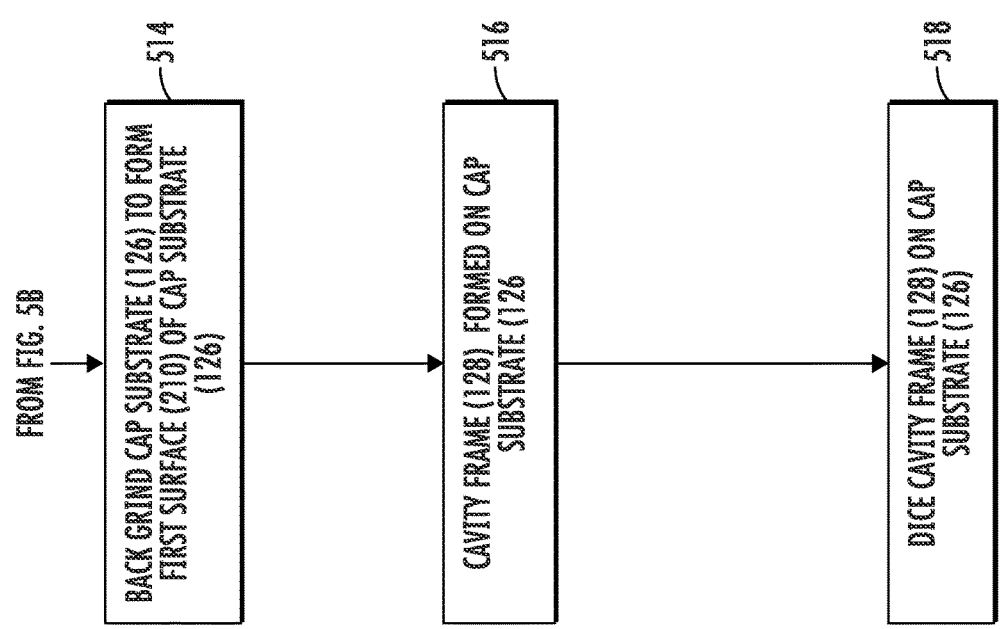

Other fabrication methods can be employed to fabricate a SAW filter package employing an enhanced thermally conductive cavity frame for heat dissipation with a co-planar cap substrate and cavity frame, including, but not limited to, the SAW filter package 102 in FIGS. 1A-2C. For example, FIGS. 5A-5C are a flowchart illustrating an exemplary fabrication process 500 for fabricating an enhanced thermally conductive cavity frame co-planar with a cap substrate to be used in a SAW filter package, including, but not limited to, the cavity frame 128 and cap substrate 126 in the SAW filter package 102 in FIGS. 1A-2C. For example, as discussed above with regard to the SAW filter package 102 in FIGS. 1A-2C, it may be desired to form the cavity frame 128 on the cap substrate 126 before coupling these package components on the substrate 104 as a convenient method to achieve co-planarity between the side walls 130, 132 of the cap substrate 126 and cavity frame 128. This can avoid or reduce misalignment between the cap substrate 126 and cavity frame 128 that may otherwise occur if the cavity frame 128 is formed on the substrate 104, wherein the cap substrate 126 must then be aligned and coupled to the cavity frame 128 that has a staggered width to provide an alignment tolerance to the cap substrate 126. Further, forming the cavity frame 128 on the cap substrate 126 may also be advantageous if the thermal budget for deposition of the cavity frame 128 material exceeds the thermal budget of the substrate 104. This can avoid diffusion of the metal interconnects in the metallization layers 116(1)-116(2) of the substrate 104 that could adversely affect performance of the SAW filter package 102. The cap substrate 126 may be formed from a material that does not include metallization structures and thus can tolerate the increased thermal budget for the cavity frame 128 material deposition. FIGS. 6A-6I illustrate exemplary fabrication stages 600A-600I during fabrication of an enhanced thermally conductive cavity frame co-planar with a cap substrate for a SAW filter package for heat dissipation, including, but not limited to, the cavity frame 128 and cap substrate 126 in the SAW filter package 102 in FIGS. 1A-2C, according to the exemplary fabrication process 500 in FIGS. 5A-5C. The fabrication process 500 and exemplary fabrication stages 600A-600I in FIGS. 6A-6I will be discussed with reference to the SAW filter package 102 example in FIGS. 1A-2C.

In this regard, a step in the fabrication process 500 of the cavity frame 128 disposed on the cap substrate 126 is to provide the cap substrate 126 (block 502 in FIG. 5A). This is illustrated in the exemplary fabrication stage 600A in FIG. 6A. For example, the cap substrate 126 may a Silicon material. As shown in the fabrication stage 600B in FIG. 6B. next step in the fabrication process 500 can then include depositing an etch material layer 602 comprising an etch material 604 on a first surface 606 of the cap substrate 126 (block 504 in FIG. 5A). For example, the etch material 604 may be Silicon Dioxide. The etch material layer 602 is disposed on the cap substrate 126 as a material that can be patterned with openings for a cavity frame material to be disposed in the openings to form the cavity frame 128 on the cap substrate 126. This is shown in the fabrication stage 600C in FIG. 6C. As shown therein, a next step in the fabrication process 500 is to pattern the etch material layer 602 to form perimeter openings 608(1), 608(2) in the etch material 604 (block 506 in FIG. 5A). The fabrication stage 600C in FIG. 6C illustrates two (2) perimeter openings 608(1), 608(2), however it should be note that the fabrication stage 600C in FIG. 6C is shown as a cross-section and that perimeter openings 608 are formed in the etch material layer 602 in a closed pattern.

As shown in fabrication stage 600D in FIG. 6D, a next step in the fabrication process 500 can be to dispose a cavity frame material 610 that will be used to form the cavity frame 128 in the perimeter openings 608(1), 608(2) (block 508 in FIG. 5B). As shown in fabrication stage 600E in FIG. 6E, a next step in the fabrication process 500 can be to grind down and/or polish a top surface 612 of the cavity frame material 610 to form the second perimeter surface 204(2) of the cavity frame 128 (block 510 in FIG. 5B). Then, as shown in fabrication stage 600F in FIG. 6F, a next step in the fabrication process 500 can be to remove (e.g., etch away) the etch material 604 remaining in the etch material layer 602 to leave the cavity frame 128 formed on the cap substrate 126 (block 512 in FIG. 5B). Note that the fabrication process 500 may involve forming several adjacent cavity frames 128 on the cap substrate 126 that can later be diced as discussed below to form individual packages.

Figure 6G:
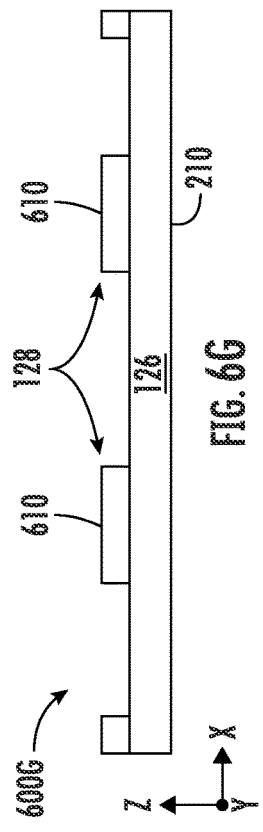
Figure 6H:
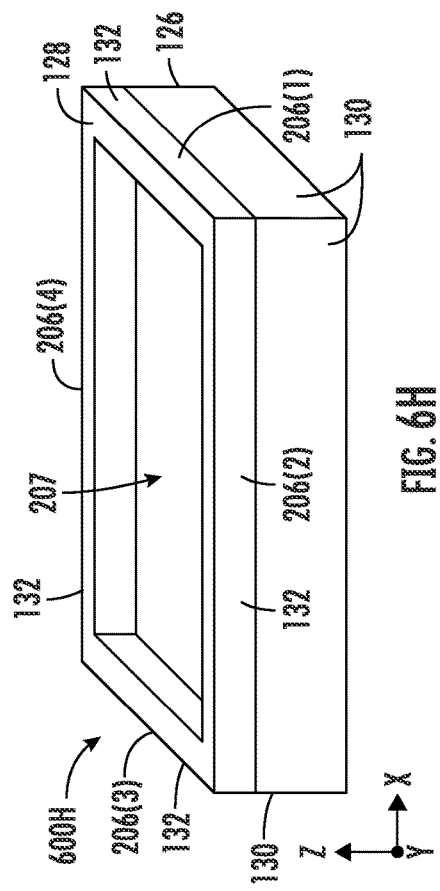
Figure 6I:
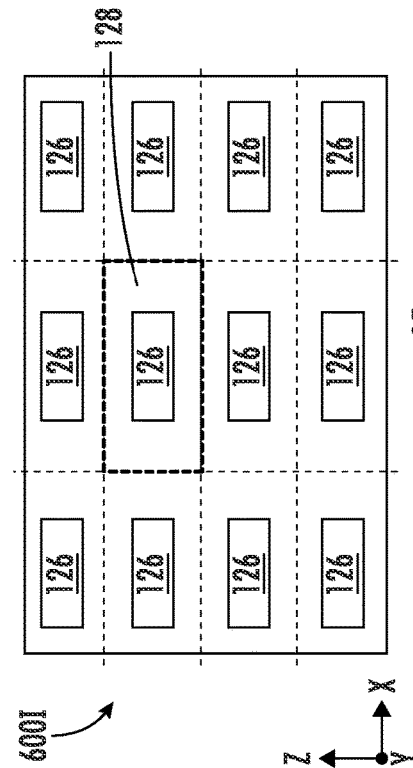

As shown in fabrication stage 600G in FIG. 6G, a next step in the fabrication process 500 can be to backgrind the cap substrate 126 to form the first surface 210 of the cap substrate 126 (block 514 in FIG. 5D). As shown in fabrication stage 600H in FIG. 6H, a cavity frame 128 with its side structures 206(1)-206(4) formed from the cavity frame material 610 is formed on the cap substrate 126 (block 516 in FIG. 5C). As shown in fabrication stage 600I in FIG. 6I, this process may form a plurality of cavity frames 128 formed on the cap substrate 126. The side structures 206(1)-206(4) can be diced through the cap substrate 126 in the vertical direction (Z-axis direction) to form co-planar side walls 130, 132 between the cap substrate 126 and the cavity frame 128 as previously discussed (block 518 in FIG. 6I). For example, a laser may be employed to dice through the cap substrate 126 in the vertical direction (Z-axis direction) to form co-planar side walls 130, 132 between the cap substrate 126 and the cavity frame 128.

Figure 8A:
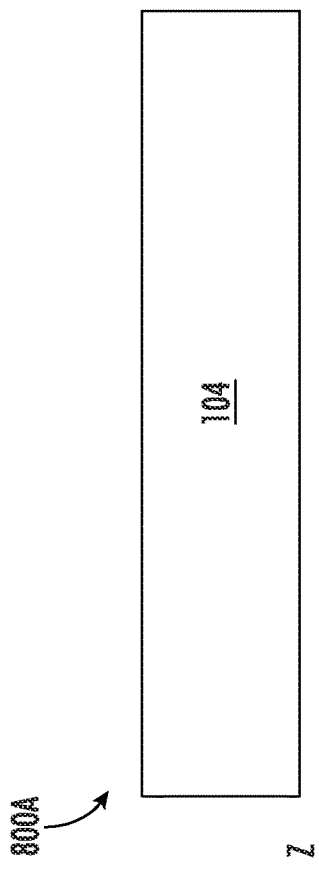
FIGS. 8A and 8B illustrate exemplary fabrication stages during fabrication of a substrate for a SAW filter package, including, but not limited to, the substrate in the SAW filter package in FIGS. 1A-2C, according to the exemplary fabrication process in FIG. 7.
Figure 8B:
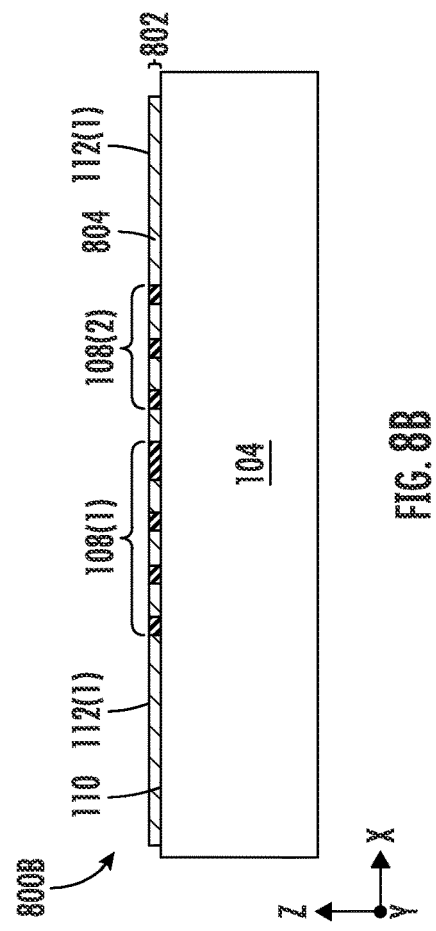
Figure 7:
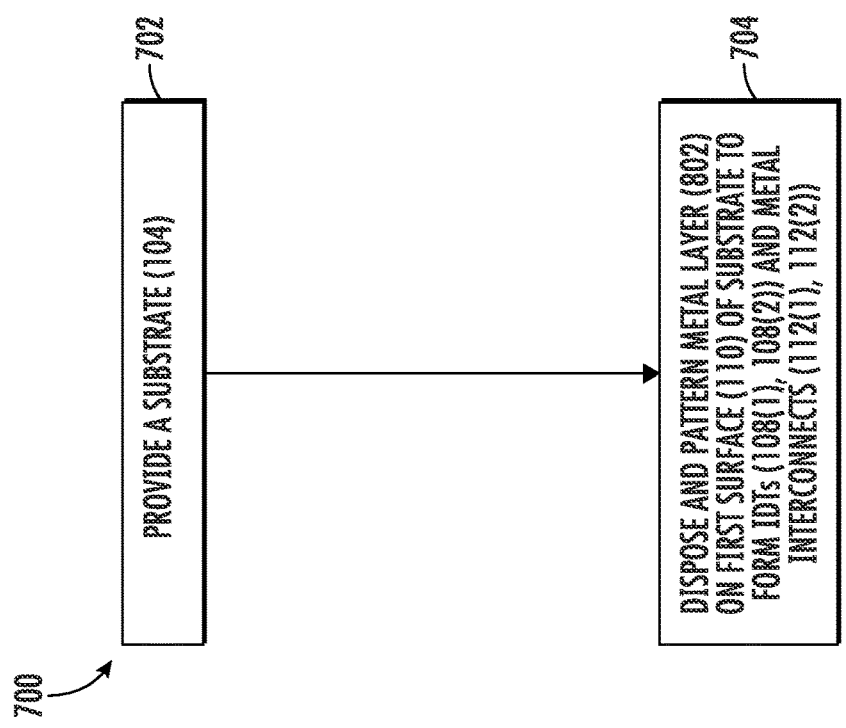
FIG. 7 is a flowchart illustrating an exemplary process for fabricating a substrate for a SAW filter package, including, but not limited to, the substrate in the SAW filter package in FIGS. 1A-2C.

FIG. 7 is a flowchart illustrating an exemplary process 700 for fabricating a substrate for a SAW filter package, including, but not limited to, the substrate 104 in the SAW filter package 102 in FIGS. 1A-2C. FIGS. 8A and 8B illustrate exemplary fabrication stages 800A, 800B during fabrication of the substrate for the SAW filter package, including, but not limited to, the substrate 104 in the SAW filter package 102 in FIGS. 1A-2C, according to the exemplary fabrication process 700 in FIG. 7. The fabrication process 700 and exemplary fabrication stages 800A, 800B in FIGS. 8A and 8B will be discussed with reference to the SAW filter package 102 example in FIGS. 1A-2C.

In this regard, as illustrated in the exemplary fabrication stage 800A in FIG. 8A, a substrate 104 is provided (block 702 in FIG. 7). For example, the substrate 104 may be a Lithium Niobate (LiNbO$_3$) substrate. As illustrated in the exemplary fabrication stage 800B in FIG. 8B, a metal layer 802 of a metal material 804 is disposed on the first surface 110 of the substrate 104 to form the IDTs 108(1), 108(2) and their metal interconnects 112(1), 112(2) (block 704 in FIG. 7). For example, the metal material 804 may be Aluminum as an example. Then, as provided in the exemplary process 900 in FIG. 9 and as shown in the exemplary fabrication stages 1000A, 1000B in FIGS. 10A and 10B, the SAW filter package 102 can be assembled by taking the combination cavity frame 128 formed on the cap substrate 126 according to the exemplary fabrication process 500 and exemplary fabrication stages 600A-600I in FIGS. 5A-6I and coupling same to the substrate 104 fabricated according to the exemplary fabrication process 700 and exemplary fabrication stages 800A, 800B in FIGS. 8A and 8B. This then forms the cavity 120 between the substrate 104 and cap substrate 126 by the cavity frame 128 disposed therebetween.

Figure 10A:
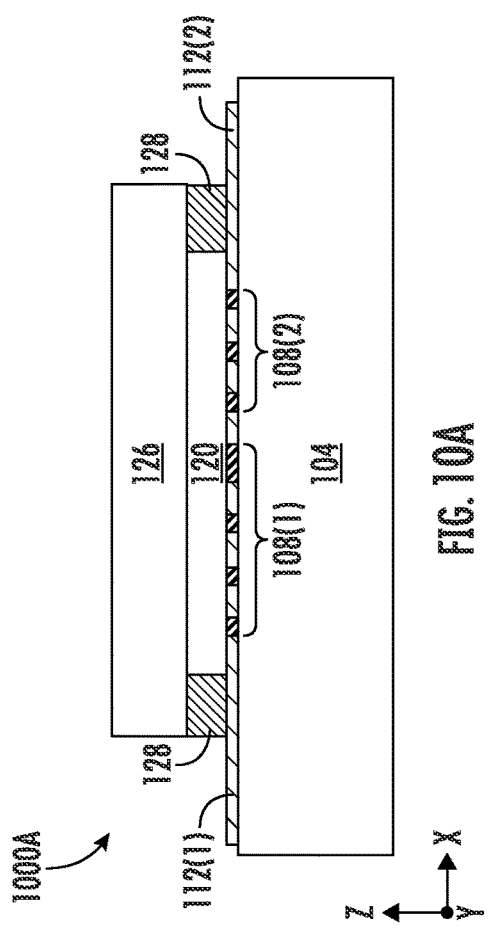
FIGS. 10A and 10B illustrate exemplary fabrication stages during assembly of an enhanced thermally conductive cavity frame co-planar with a cap substrate, coupled to a substrate to create a SAW filter package, including, but not limited to, the SAW filter package in FIGS. 1A-2C, according to the exemplary fabrication process in FIG. 9.
Figure 10B:
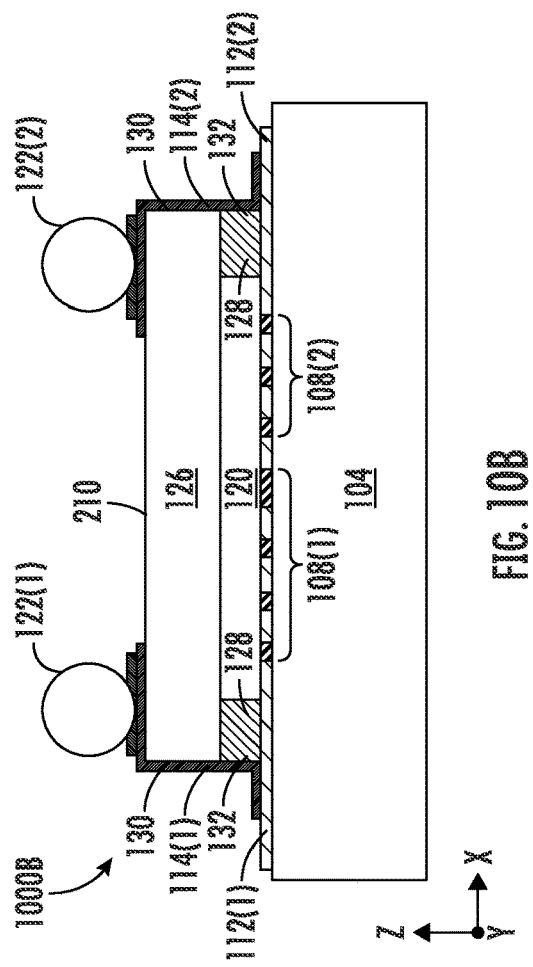
Figure 9:
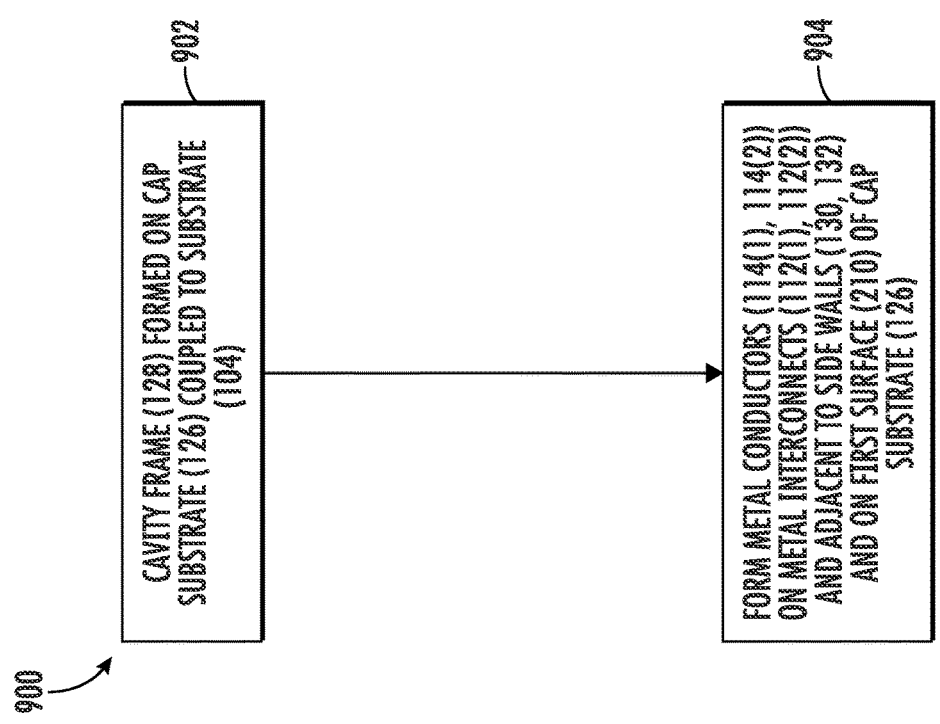
FIG. 9 is a flowchart illustrating an exemplary process for assembling an enhanced thermally conductive cavity frame co-planar with a cap substrate, coupled to a substrate to create a SAW filter package, including, but not limited to, the SAW filter package in FIGS. 1A-2C.

In this regard, as illustrated in the exemplary fabrication stage 1000A in FIG. 10A, the cavity frame 128 formed on the cap substrate 126 is coupled to the substrate 104 such that the cavity 120 is formed with the IDTs 108(1), 108(2) disposed inside the cavity 120 (block 902 in FIG. 9). The metal interconnects 112(1), 112(1) may be provided as an Aluminum material for example, to facilitate bonding of the cavity frame 128 as a diamond cavity frame as an example. The bonding of the cavity frame 128 formed on the cap substrate 126, to the substrate 104 may be performed at lower temperatures, including at room temperature, without exceeding the thermal budget of the substrate 104, and thus impacting the substrate 104, because the higher temperatures that may be needed to form the cavity frame 128 are done on the cap substrate 126 and not on the substrate 104 in this example. Thereafter, as shown in exemplary fabrication stage 1000B in FIG. 10B, the metal conductors 114(1), 114(2) can be formed on the metal interconnects 112(1), 112(2) and adjacent to the side walls 130, 132 and on the first surface 210 of the cap substrate 126 to form interconnects between the IDTs 108(1), 108(2) and the metal interconnects 122(1), 122(2) (e.g., solder bumps, solder balls) coupled to the metal conductors 114(1), 114(2) (block 904 in FIG. 9). The metal conductors 114(1), 114(2) may be formed by a Titanium deposition on a Copper seed layer, for example, and patterned as Copper Nickel traces. The metal interconnects 122(1), 122(2) can be formed on patterned interconnects as solder bumps or balls (e.g., SnAugCu solder balls).

Note that a SAW filter package can also be provided like the SAW filter package 102 in FIGS. 1-2C and 5A-10B that includes a cavity frame of an enhanced thermally conductive material to facilitate heat dissipation, but the cavity frame can be formed on the substrate instead of the cap substrate. In this manner, the cavity frame and cap substrate may include a staggered configuration where their respective side walls do not extend to the same point out from the air cavity to be co-planar. Such an example of a SAW filter package 102 is illustrated in FIGS. 11-12B.

Figure 11:
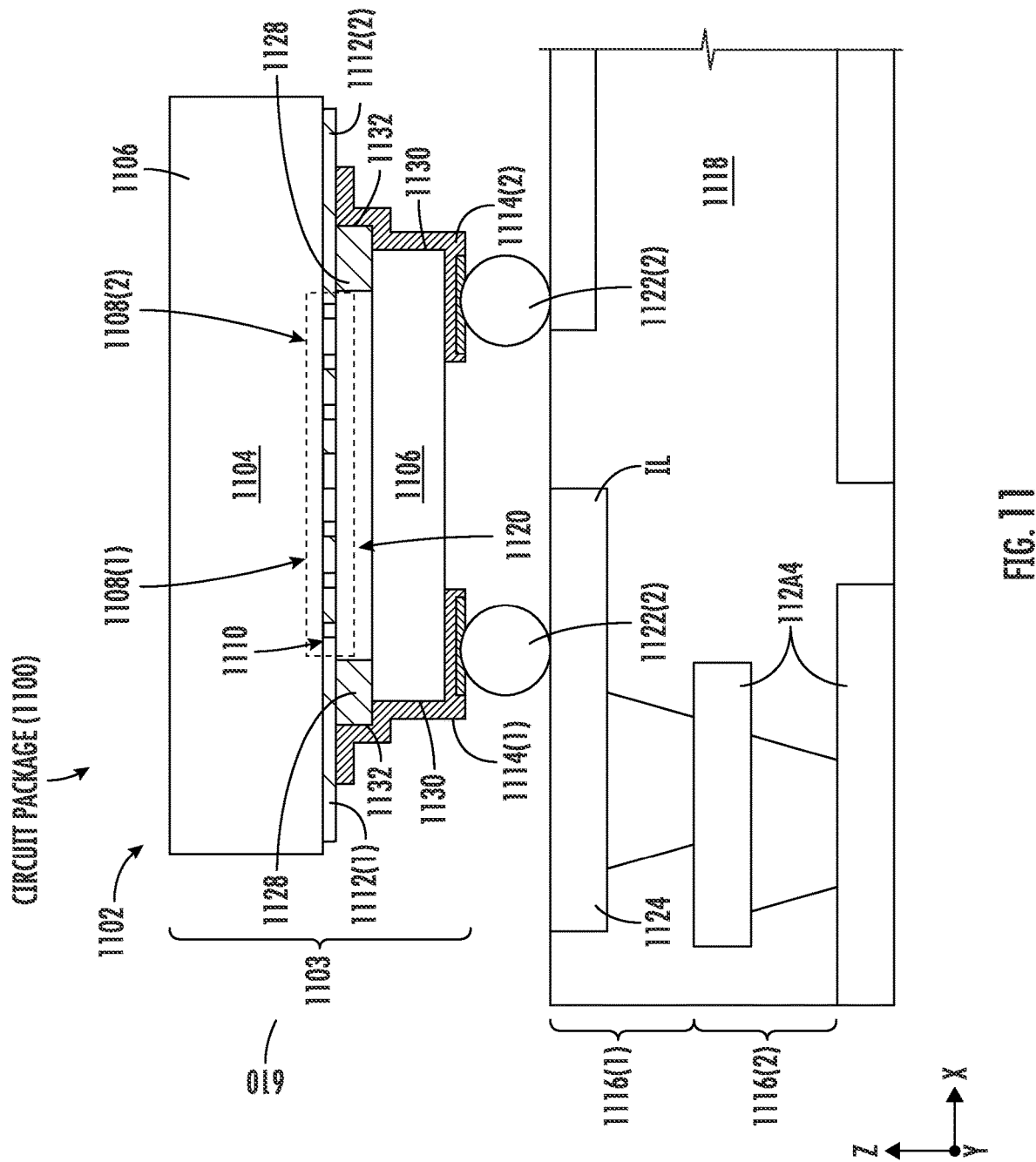
FIG. 11 is a cross-sectional side view of an exemplary circuit package that includes a SAW filter employing an enhanced thermally conductive cavity frame for heat dissipation.

In this regard, FIG. 11 a cross-sectional side view of an exemplary circuit package 1100 that includes a SAW filter package 1102 that provides a SAW filter circuit 1103. The SAW filter package 1102 is configured to block certain frequency ranges of an input RF signal. For example, the circuit package 1100 may be included in another IC package that includes RF transmission/reception circuity and antennas where the SAW filter package 1102 is employed to filter transmitted and/or received RF signals. The SAW filter package 1102 includes a substrate 1104 that is made from a piezoelectric material 1106 in this example. A first IDT 1108(1) is disposed on a first surface 1110 of the substrate 1104 as an input circuit. A second IDT 1108(2) is also disposed on the first surface 1110 of the substrate 1104 adjacent to the first IDT 1108(1) as an output circuit. The first IDT 1108(1) is configured to receive a RF signal through a first metal interconnect 1112(1) coupled to a first metal conductor 1114(1). The first metal conductor 1114(1) is coupled through a metal interconnect 1122(2) (e.g., solder bumps, solder balls) on a cap substrate 1126, to metal interconnects 1124 (e.g., metal lines, metal traces, vias) in metallization layers 1116(1), 1116(2) in a package substrate 1118 to a signal source. The first IDT 1108(1) is configured to convert the received electrical RF signal into an acoustic wave that is emitted in a cavity 1120, which may be an air cavity. The second IDT 1108(2) is configured to receive a filtered acoustic wave of the emitted acoustic wave emitted by the first IDT 1108(1) and convert filtered acoustic wave into a filtered RF signal. The filtered RF signal is coupled to a second metal interconnect 1112(2) coupled to a second metal conductor 1114(2). The second metal conductor 1114(2) is coupled through the metal interconnect 1122(2) (e.g., solder bumps, solder balls) on the cap substrate 1126, to metal interconnects 1124 in metallization layers 1116(1), 1116(2) in the package substrate 1118 to another circuit to receive the filtered RF signal.

To form the cavity 1120 in the SAW filter package 1102 in FIG. 11, the cap substrate 1126 is disposed on a cavity frame 1128 that is disposed on the substrate 1104. The cavity frame 1128 provides a stand-off between the cap substrate 1126 and the substrate 1104. The cap substrate 1126 is a substrate of material that is used to form the cavity 1120. The cap substrate 1126 is disposed on a frame perimeter structure of the cavity frame 1128 to enclose the cavity 1120 inside the frame perimeter structure between the substrate 1104 and the cap substrate 1126. Heat is generated inside the cavity 1120 as a result of the operation of the SAW filter circuit 1103. Excessive heat that is not effectively dissipated can increase the temperature of the SAW filter circuit 1103 and negatively affect its filtering performance. The SAW filter circuit 1103 will shift its blocking frequencies upwards at lower temperatures and downwards at higher temperatures in a linear fashion. Thus, it is important to effectively dissipate heat generated in the SAW filter package 102 to maintain the desired performance of the SAW filter circuit 1103. In this regard, as discussed in more detail below, in this example, the cavity frame 1128 is comprised of a material that has an enhanced thermally conductivity, as opposed to for example, a polymer material that is not a good thermal conductor. For example, the cavity frame 1128 may be comprised of a diamond material to provide a diamond cavity frame. As another example, the cavity frame 1128 may be comprised of a material that has a thermal conductivity of at least five (5) W/m-K. A diamond cavity frame may have a thermal conductivity between and including 600-2,000 W/m-K. In this manner, heat generated in the SAW filter package 1102 can more effectively be dissipated, particularly at edges and corners of the cavity frame 1128 where hot spots can particularly occur.

Figure 12A:
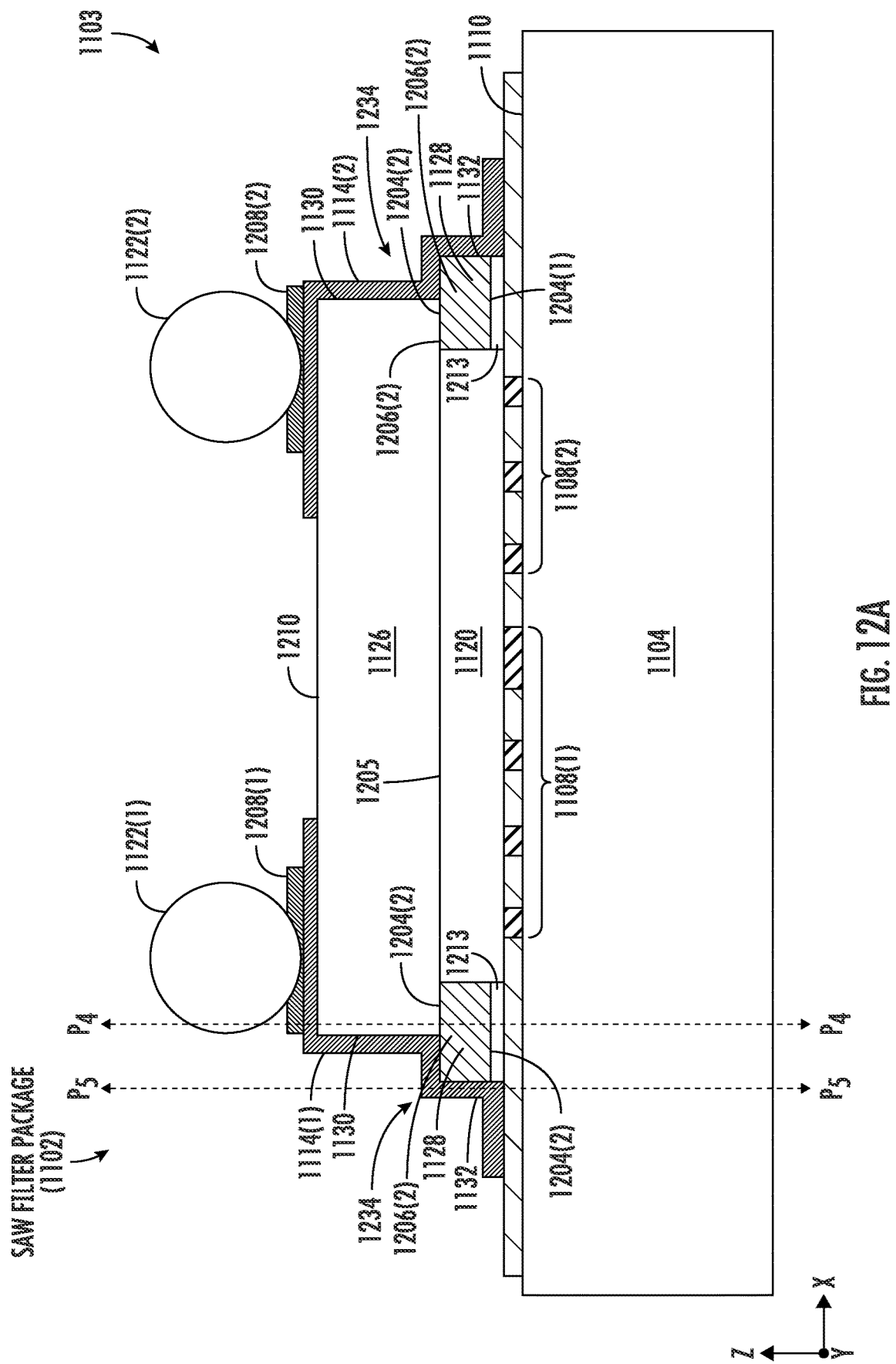
FIG. 12A is a perspective side view of the SAW filter package in the circuit package in FIG. 11 employing an enhanced thermally conductive cavity frame for heat dissipation.

FIG. 12A illustrates another cross-sectional side view of the SAW filter package 1102 in FIG. 11. As illustrated in FIG. 12A, the first and second IDTs 1108(1), 1108(2) of the SAW filter package 1102 are disposed on the first surface 1110 of the substrate 1104. The cavity frame 1128 is disposed between the cap substrate 1126 and the first surface 1110 of the substrate 1104. As shown in FIG. 12B, the cavity frame 1128 includes a frame perimeter structure 1200 that has an internal cavity 1202 inside the frame perimeter structure 1200. The internal cavity 1202 will create the cavity 1120 of the SAW filter package 1102 as a result of the cavity frame 1128 being disposed between the substrate 1014 and the cap substrate 1126. As discussed above, the cavity frame 1128 can have a thermal conductivity of at least five (5) W/m-K to be more effective in dissipating heat generated in the SAW filter package 1102. This is opposed to providing the cavity frame 1128 of a polymer material that may have a thermal conductivity between 0.1-0.5 W/m-K. For example, the cavity frame 1128 may be a diamond cavity frame made from a diamond material that has a thermal conductivity between and including 600-2,000 W/m-K. Providing the cavity frame 1128 as a diamond cavity frame may also allow the material of the cap substrate 1126 to be provided of a less expensive material, such as Silicon, because as discussed below, the cavity frame 1128 is formed on the cap substrate 1126 in an exemplary fabrication process. Diamond material can be disposed (e.g., through a deposition or sputtering process) and bonded to Silicon.

With continuing reference to FIG. 12A, the frame perimeter structure 1200 includes a first perimeter surface 1204(1) that is disposed on or adjacent to the first surface 1110 of the substrate 1104. Other examples of materials that can be used to form the cavity frame 1128 and that have an enhanced thermal conductivity include aluminum oxide, silicon nitride, and/or sapphire, as non-limiting examples. The frame perimeter structure 1200 also has a second perimeter surface 1204(2) that is on the opposite side of the first perimeter surface 1204(1) in a vertical axis direction (Z-axis direction). The second perimeter surface 1204(2) of the frame perimeter structure 1200 is disposed on or adjacent to a second surface 1205 of the cap substrate 1126. Metal interconnects 1208(1), 1208(2) are disposed on or adjacent to a first surface 1210 of the cap substrate 1126 to support the coupling of the metal interconnects 1122(1), 1122(2) to the metal conductors 1114(1), 1114(2). The first perimeter surface 1204(1) of the frame perimeter structure 1200 of the cavity frame 1128 may be disposed on a pad 1213 that is disposed on the first surface 1110 of the substrate 1104, to facilitate bonding of the material of the cavity frame 1128 to the substrate 1104. For example, the pad 1213 may be an Aluminum pad that supports the bonding of a diamond cavity frame 1128 to the substrate 1104.

In the example of the SAW filter package 1102 shown in FIG. 12B, the frame perimeter structure 1200 of the cavity frame 1128 comprises a rectangular-shaped frame perimeter structure that includes four side structures 1206(1)-1206(4) disposed at right angles to each other. The four side structures 1206(1)-1204(4) of the frame perimeter structure 1200 define an outer perimeter with a cavity 1207 formed inside the frame perimeter structure 1200. The first perimeter surface 1204(1) of the frame perimeter structure 1200 is formed by the bottom surfaces of the side structures 1206(1)-1206(4) in FIG. 12B. The second perimeter surface 1204(2) of the frame perimeter structure 1200 is formed by the top surfaces of the side structures 1206(1)-206(4). To also assist in the performance of the SAW filter circuit provided by the SAW filter package 1102, the cavity frame 1128 may be provided that has a CTE less than or equal to ten (10) ppm/deg C. In this manner, the cavity frame 1128 is less susceptive to expansion and contraction in response to temperature changes that may occur due to heat generated during operation of the SAW filter circuit 1103. For example, a cavity frame 1128 made from a diamond material may have a CTE less than or equal to one (1) ppm/deg C. Further, to reduce or minimize the electrical interference between the cavity frame 1128 and the substrate 1104 and the IDTs 1108(1), 1108(2) in the SAW filter package 102, the cavity frame 1128 may be provided of a material that has an electrical resistivity greater than or equal to $1 \times 10^{10}$ Ohms cm. For example, a cavity frame 1128 made from a diamond material may have an electrical resistivity between and including $1 \times 10^{14}$ and $1 \times 10^{18}$ Ohms cm.

With reference back to FIG. 12A, side walls 1130 of the cap substrate 1126 are staggered with side walls 1132 of the cavity frame 1128. The side walls 1130 of the cap substrate 1126 extend in a horizontal direction (X-axis direction) to plane $P_4$ in the Y-X axes. The side walls 1132 of the cavity frame 1128 extend in a horizontal direction (X-axis direction) to plane $P_5$ in the Y-X axes that extends further away from the cavity 1120 than the side walls 1130. This creates a shoulder area 1234 between the side walls 1130, 1132 that extends the path length of the metal conductors 1114(1), 1114(2). However, the staggered cap substrate 1126 and cavity frame 1128 can also have the effect of extending the width of the SAW filter package 1102 in the horizontal direction (X-axis direction) over the SAW filter package 102 in FIGS. 1A-2C. This is so that there is an alignment tolerance between the cavity frame 1128 and the cap substrate 1126.

A SAW filter package employing an enhanced thermally conductive cavity frame for heat dissipation and/or a co-planar cap substrate and cavity frame for die size reduction and shorter metal interconnect paths, including, but not limited to, the exemplary SAW filter packages in FIGS. 1-2B and 11-12B and according to the exemplary fabrication processes in FIGS. 4-10B, may be provided in or integrated into any processor-based device. Examples, without limitation, include a set top box, an entertainment unit, a navigation device, a communications device, a fixed location data unit, a mobile location data unit, a global positioning system (GPS) device, a mobile phone, a cellular phone, a smart phone, a session initiation protocol (SIP) phone, a tablet, a phablet, a server, a computer, a portable computer, a mobile computing device, a wearable computing device (e.g., a smart watch, a health or fitness tracker, eyewear, etc.), a desktop computer, a personal digital assistant (PDA), a monitor, a computer monitor, a television, a tuner, a radio, a satellite radio, a music player, a digital music player, a portable music player, a digital video player, a video player, a digital video disc (DVD) player, a portable digital video player, an automobile, a vehicle component, avionics systems, a drone, and a multicopter.

Figure 13:
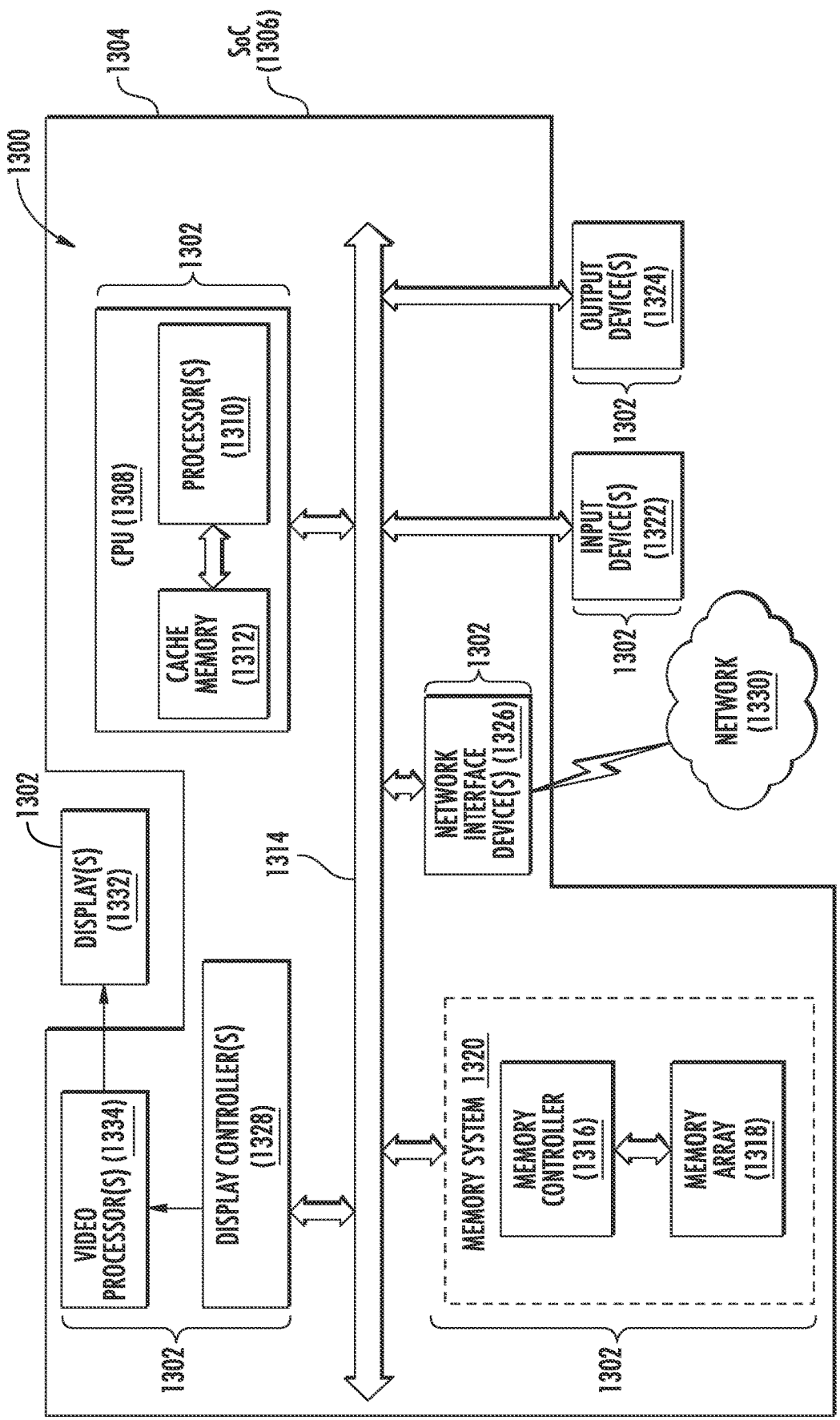
FIG. 13 is a block diagram of an exemplary processor-based system that can include components that can include a SAW filter package employing an enhanced thermally conductive cavity frame for heat dissipation and/or a co-planar cap substrate and cavity frame for die size reduction and shorter metal interconnect paths, including, but not limited, to the SAW filter packages in FIGS. 1A-2C and 11-12B, and according to the exemplary fabrication processes in FIGS. 4-10B.

In this regard, FIG. 13 illustrates an example of a processor-based system 1300. The components of the processor-based system 1300 are ICs 1302. Some or all of the ICs 1302 in the processor-based system 1300 can be provided in a SAW filter package 1304 employing an enhanced thermally conductive cavity frame for heat dissipation and/or a co-planar cap substrate and cavity frame for die size reduction and shorter metal interconnect paths, including, but not limited to, the exemplary SAW filter packages in FIGS. 1-2B and 11-12B and according to the exemplary fabrication processes in FIGS. 4-10B, and according to any aspects disclosed herein. In this example, the processor-based system 1300 may be formed as a SAW filter package 1304 and as a system-on-a-chip (SoC) 1306. The processor-based system 1300 includes a CPU 1308 that includes one or more processors 1310, which may also be referred to as CPU cores or processor cores. The CPU 1308 may have cache memory 1312 coupled to the CPU 1308 for rapid access to temporarily stored data. The CPU 1308 is coupled to a system bus 1314 and can intercouple master and slave devices included in the processor-based system 1300. As is well known, the CPU 1308 communicates with these other devices by exchanging address, control, and data information over the system bus 1314. For example, the CPU 1308 can communicate bus transaction requests to a memory controller 1316 as an example of a slave device. Although not illustrated in FIG. 13, multiple system buses 1314 could be provided, wherein each system bus 1314 constitutes a different fabric.

Other master and slave devices can be connected to the system bus 1314. As illustrated in FIG. 13, these devices can include a memory system 1320 that includes the memory controller 1316 and a memory array(s) 1318, one or more input devices 1322, one or more output devices 1324, one or more network interface devices 1326, and one or more display controllers 1328, as examples. Each of the memory system 1320, the one or more input devices 1322, the one or more output devices 1324, the one or more network interface devices 1326, and the one or more display controllers 1328 can be provided in the same or different circuit packages. The input device(s) 1322 can include any type of input device, including, but not limited to, input keys, switches, voice processors, etc. The output device(s) 1324 can include any type of output device, including, but not limited to, audio, video, other visual indicators, etc. The network interface device(s) 1326 can be any device configured to allow exchange of data to and from a network 1330. The network 1330 can be any type of network, including, but not limited to, a wired or wireless network, a private or public network, a local area network (LAN), a wireless local area network (WLAN), a wide area network (WAN), a BLUETOOTH™ network, and the Internet. The network interface device(s) 1326 can be configured to support any type of communications protocol desired.

The CPU 1308 may also be configured to access the display controller(s) 1328 over the system bus 1314 to control information sent to one or more displays 1332. The display controller(s) 1328 sends information to the display(s) 1332 to be displayed via one or more video processors 1334, which process the information to be displayed into a format suitable for the display(s) 1332. The display controller(s) 1328 and video processor(s) 1334 can be included as SAW filter package 1304 and the same or different circuit packages, and in the same or different circuit packages containing the CPU 1308 as an example. The display(s) 1332 can include any type of display, including, but not limited to, a cathode ray tube (CRT), a liquid crystal display (LCD), a plasma display, a light emitting diode (LED) display, etc.

Figure 14:
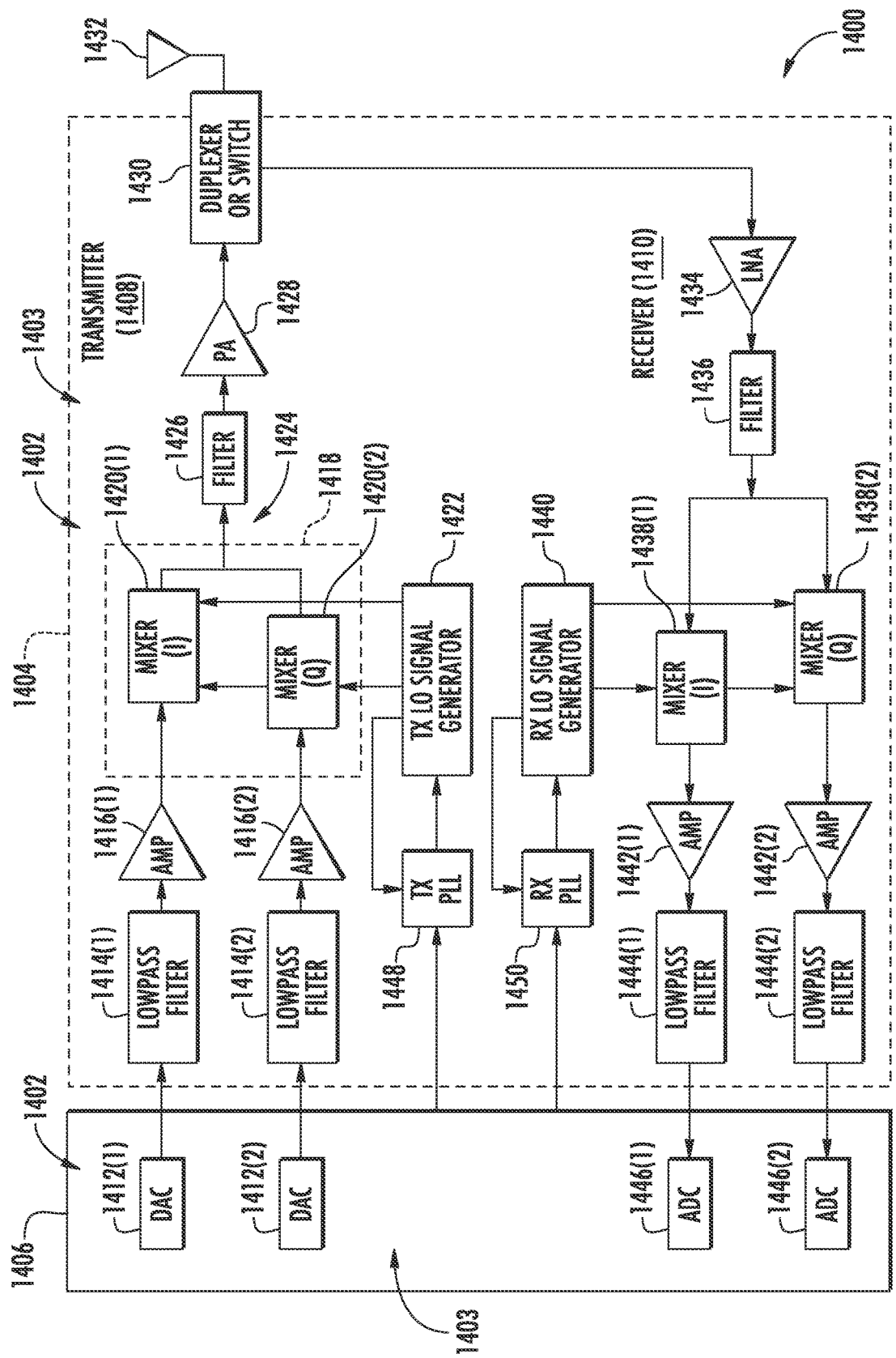
FIG. 14 is a block diagram of an exemplary wireless communications device that includes radio-frequency (RF) components that can include a SAW filter package employing an enhanced thermally conductive cavity frame for heat dissipation and/or a co-planar cap substrate and cavity frame for die size reduction and shorter metal interconnect paths, including, but not limited to, the SAW filter packages in FIGS. 1A-2C and 11-12B, and according to the exemplary fabrication processes in FIGS. 4-10B.

FIG. 14 illustrates an exemplary wireless communications device 1400 that includes radio frequency (RF) components formed from one or more ICs 1402, wherein any of the ICs 1402 can include a SAW filter package(s) 1403 employing an enhanced thermally conductive cavity frame for heat dissipation and/or a co-planar cap substrate and cavity frame for die size reduction and shorter metal interconnect paths, including but not limited to, the exemplary SAW filter packages in FIGS. 1-2B and 11-12B and according to the exemplary fabrication processes in FIGS. 4-10B, and according to any aspects disclosed herein. The wireless communications device 1400 may include or be provided in any of the above-referenced devices, as examples. As shown in FIG. 14, the wireless communications device 1400 includes a transceiver 1404 and a data processor 1406. The data processor 1406 may include a memory to store data and program codes. The transceiver 1404 includes a transmitter 1408 and a receiver 1410 that support bi-directional communications. In general, the wireless communications device 1400 may include any number of transmitters 1408 and/or receivers 1410 for any number of communication systems and frequency bands. All or a portion of the transceiver 1404 may be implemented on one or more analog ICs, RFICs, mixed-signal ICs, etc.

The transmitter 1408 or the receiver 1410 may be implemented with a super-heterodyne architecture or a direct-conversion architecture. In the super-heterodyne architecture, a signal is frequency-converted between RF and baseband in multiple stages, e.g., from RF to an intermediate frequency (IF) in one stage, and then from IF to baseband in another stage for the receiver 1410. In the direct-conversion architecture, a signal is frequency-converted between RF and baseband in one stage. The super-heterodyne and direct-conversion architectures may use different circuit blocks and/or have different requirements. In the wireless communications device 1400 in FIG. 14, the transmitter 1408 and the receiver 1410 are implemented with the direct-conversion architecture.

In the transmit path, the data processor 1406 processes data to be transmitted and provides I and Q analog output signals to the transmitter 1408. In the exemplary wireless communications device 1400, the data processor 1406 includes digital-to-analog converters (DACs) 1412(1), 1412(2) for converting digital signals generated by the data processor 1406 into the I and Q analog output signals, e.g., I and Q output currents, for further processing.

Within the transmitter 1408, lowpass filters 1414(1), 1414(2) filter the I and Q analog output signals, respectively, to remove undesired signals caused by the prior digital-to-analog conversion. Amplifiers (AMPs) 1416(1), 1416(2) amplify the signals from the lowpass filters 1414(1), 1414(2), respectively, and provide I and Q baseband signals. An upconverter 1418 upconverts the I and Q baseband signals with I and Q transmit (TX) local oscillator (LO) signals through mixers 1420(1), 1420(2) from a TX LO signal generator 1422 to provide an upconverted signal 1424. A filter 1426 filters the upconverted signal 1424 to remove undesired signals caused by the frequency upconversion as well as noise in a receive frequency band. A power amplifier (PA) 1428 amplifies the upconverted signal 1424 from the filter 1426 to obtain the desired output power level and provides a transmit RF signal. The transmit RF signal is routed through a duplexer or switch 1430 and transmitted via an antenna 1432.

In the receive path, the antenna 1432 receives signals transmitted by base stations and provides a received RF signal, which is routed through the duplexer or switch 1430 and provided to a low noise amplifier (LNA) 1434. The duplexer or switch 1430 is designed to operate with a specific receive (RX)-to-TX duplexer frequency separation, such that RX signals are isolated from TX signals. The received RF signal is amplified by the LNA 1434 and filtered by a filter 1436 to obtain a desired RF input signal. Down-conversion mixers 1438(1), 1438(2) mix the output of the filter 1436 with I and Q RX LO signals (i.e., LO_I and LO_Q) from an RX LO signal generator 1440 to generate I and Q baseband signals. The I and Q baseband signals are amplified by AMPs 1442(1), 1442(2) and further filtered by lowpass filters 1444(1), 1444(2) to obtain I and Q analog input signals, which are provided to the data processor 1406. In this example, the data processor 1406 includes analog-to-digital converters (ADCs) 1446(1), 1446(2) for converting the analog input signals into digital signals to be further processed by the data processor 1406.

In the wireless communications device 1400 of FIG. 14, the TX LO signal generator 1422 generates the I and Q TX LO signals used for frequency upconversion, while the RX LO signal generator 1440 generates the I and Q RX LO signals used for frequency downconversion. Each LO signal is a periodic signal with a particular fundamental frequency. A TX phase-locked loop (PLL) circuit 1448 receives timing information from the data processor 1406 and generates a control signal used to adjust the frequency and/or phase of the TX LO signals from the TX LO signal generator 1422. Similarly, an RX PLL circuit 1450 receives timing information from the data processor 1406 and generates a control signal used to adjust the frequency and/or phase of the RX LO signals from the RX LO signal generator 1440.

Those of skill in the art will further appreciate that the various illustrative logical blocks, modules, circuits, and algorithms described in connection with the aspects disclosed herein may be implemented as electronic hardware, instructions stored in memory or in another computer readable medium and executed by a processor or other processing device, or combinations of both. Memory disclosed herein may be any type and size of memory and may be configured to store any type of information desired. To clearly illustrate this interchangeability, various illustrative components, blocks, modules, circuits, and steps have been described above generally in terms of their functionality. How such functionality is implemented depends upon the particular application, design choices, and/or design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the aspects disclosed herein may be implemented or performed with a processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A processor may be a microprocessor, but in the alternative, the processor may be any conventional processor, controller, microcontroller, or state machine. A processor may also be implemented as a combination of computing devices (e.g., a combination of a DSP and a microprocessor, a plurality of microprocessors, one or more microprocessors in conjunction with a DSP core, or any other such configuration).

The aspects disclosed herein may be embodied in hardware and in instructions that are stored in hardware, and may reside, for example, in Random Access Memory (RAM), flash memory, Read Only Memory (ROM), Electrically Programmable ROM (EPROM), Electrically Erasable Programmable ROM (EEPROM), registers, a hard disk, a removable disk, a CD-ROM, or any other form of computer readable medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a remote station. In the alternative, the processor and the storage medium may reside as discrete components in a remote station, base station, or server.

It is also noted that the operational steps described in any of the exemplary aspects herein are described to provide examples and discussion. The operations described may be performed in numerous different sequences other than the illustrated sequences. Furthermore, operations described in a single operational step may actually be performed in a number of different steps. Additionally, one or more operational steps discussed in the exemplary aspects may be combined. It is to be understood that the operational steps illustrated in the flowchart diagrams may be subject to numerous different modifications as will be readily apparent to one of skill in the art. Those of skill in the art will also understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The previous description of the disclosure is provided to enable any person skilled in the art to make or use the disclosure. Various modifications to the disclosure will be readily apparent to those skilled in the art, and the generic principles defined herein may be applied to other variations. Thus, the disclosure is not intended to be limited to the examples and designs described herein, but is to be accorded the widest scope consistent with the principles and novel features disclosed herein.

Implementation examples are described in the following numbered clauses:

1. A surface acoustic wave (SAW) filter package, comprising:
    a substrate comprising a piezoelectric material and having a first surface;
    a cap substrate; and
    a diamond cavity frame disposed between the substrate and the cap substrate that forms a cavity between the cap substrate and the first surface of the substrate;
    a first interdigital transducer (IDT) on the first surface of the substrate inside the cavity; and
    a second IDT on the first surface of the substrate inside the cavity.
2. The SAW filter package of clause 1, wherein the cap substrate comprises at least one cap substrate side wall that is co-planar in a vertical direction with at least one frame side wall of the diamond cavity frame.
3. The SAW filter package of any of clauses 1 and 2, wherein:
    the cap substrate comprises a first cap substrate side wall that extends along a first longitudinal axis and a second cap substrate side wall that extends along a second longitudinal axis parallel to the first longitudinal axis;
    the diamond cavity frame comprises a first frame side wall that extends along the first longitudinal axis and a second frame side wall that extends along the second longitudinal axis; and
    the first cap substrate side wall is co-planar to the first frame side wall in a vertical direction, and the second cap substrate side wall is co-planar to the second frame side wall in the vertical direction.
4. The SAW filter package of any of clauses 1-3, wherein:
    the cap substrate comprises a rectangular-shaped cap substrate frame perimeter structure;
    the diamond cavity frame comprises a rectangular-shaped diamond frame perimeter structure; and
    the rectangular-shaped cap substrate frame perimeter structure is co-planar to the rectangular-shaped diamond frame perimeter structure.
5. The SAW filter package of any of clauses 1-4, wherein the diamond cavity frame has a thermal conductivity between and including 600 and 2,000 Watts (W) per meter (m)-Kelvin (W/m-K).
6. The SAW filter package of any of clauses 1-5, wherein the diamond cavity frame has a coefficient of thermal expansion (CTE) equal to one (1) part per million (ppm) per degree Celsius (C) (ppm/deg C.) or less.
7. The SAW filter package of any of clauses 1-6, wherein the diamond cavity frame has an electrical resistivity between and including $1 \times 10^{14}$ and $1 \times 10^{18}$ Ohms centimeter (cm) (Ohms cm).
8. The SAW filter package of clause 2, further comprising
    a first metal interconnect coupled to a first surface of the cap substrate opposite a second surface of the cap substrate;
    a second metal interconnect coupled to the first surface of the cap substrate;
    a first metal conductor disposed on a first cap substrate side wall among the at least one cap substrate side wall and a first frame side wall among the at least one frame side wall and coupling the first metal interconnect to the first IDT; and
    a second metal conductor disposed on a second cap substrate side wall among the at least one cap substrate side wall and a second frame side wall among the at least one frame side wall and coupling the second metal interconnect to the second IDT.
9. The SAW filter package any of clauses 1-8, further comprising:
    an Aluminum pad disposed on the first surface of the substrate; and
    wherein:
        the diamond cavity frame is coupled to the Aluminum pad to couple the diamond cavity frame to the substrate.
10. The SAW filter package of any of clauses 1-9, wherein the cap substrate comprises a Silicon material.
11. The SAW filter package of any of clauses 1-10, wherein:
    the diamond cavity frame comprises a diamond frame perimeter structure comprising a first perimeter surface coupled to the first surface of the substrate and a second perimeter surface; and
    the cap substrate comprises a second surface coupled to the second perimeter surface of the diamond frame perimeter structure and enclosing the cavity inside the diamond frame perimeter structure between the substrate and the cap substrate.
12. The SAW filter package of any of clauses 1-11 integrated into a device selected from the group consisting of: a set top box; an entertainment unit; a navigation device; a communications device; a fixed location data unit; a mobile location data unit; a global positioning system (GPS) device; a mobile phone; a cellular phone; a smart phone; a session initiation protocol (SIP) phone; a tablet; a phablet; a server; a computer; a portable computer; a mobile computing device; a wearable computing device; a desktop computer; a personal digital assistant (PDA); a monitor; a computer monitor; a television; a tuner; a radio; a satellite radio; a music player; a digital music player; a portable music player; a digital video player; a video player; a digital video disc (DVD) player; a portable digital video player; an automobile; a vehicle component; avionics systems; a drone; and a multicopter.
13. A surface acoustic wave (SAW) filter package, comprising:

a substrate comprising a piezoelectric material and having a first surface;

a cap substrate;

a cavity frame having a thermal conductivity of at least five (5) Watts (W) per meter (m)-Kelvin (W/m-K), the cavity frame disposed between the substrate and the cap substrate that forms a cavity between the cap substrate and the first surface of the substrate;

a first interdigital transducer (IDT) on the first surface of the substrate inside the cavity; and a second IDT on the first surface of the substrate inside the cavity.

14. The SAW filter package of clause 13, wherein the cap substrate comprises at least one cap substrate side wall that is co-planar in a vertical direction with at least one frame side wall of the cavity frame.

15. The SAW filter package of any of clauses 13-14, wherein:

the cap substrate comprises a first cap substrate side wall that extends along a first longitudinal axis and a second cap substrate side wall that extends along a second longitudinal axis parallel to the first longitudinal axis;

the cavity frame comprises a first frame side wall that extends along the first longitudinal axis and a second frame side wall that extends along the second longitudinal axis; and the first cap substrate side wall is co-planar to the first frame side wall in a vertical direction, and the second cap substrate side wall is co-planar to the second frame side wall in the vertical direction.

16. The SAW filter package of any of clauses 13-15, wherein:

the cap substrate comprises a rectangular-shaped cap substrate frame perimeter structure;

the cavity frame comprises a rectangular-shaped frame perimeter structure; and the rectangular-shaped cap substrate frame perimeter structure is co-planar to the rectangular-shaped frame perimeter structure.

17. The SAW filter package of any of clauses 13-15, wherein the cavity frame has a coefficient of thermal expansion (CTE) less than or equal to ten (10) parts per million (ppm) per degree Celsius (C) (ppm/deg C.).

18. The SAW filter package of any of clauses 13-17, wherein the cavity frame has an electrical resistivity greater than or equal to $1 \times 10^{10}$ Ohms centimeter (cm) (Ohms cm).

19. The SAW filter package of any of clauses 13-18, wherein the cavity frame comprises a material comprised from the group consisting of aluminum oxide, silicon nitride, and sapphire.

20. The SAW filter package of clause 14, further comprising:

a first metal interconnect coupled to a first surface of the cap substrate opposite a second surface of the cap substrate;

a second metal interconnect coupled to the first surface of the cap substrate;

a first metal conductor disposed on a first cap substrate side wall among the at least one cap substrate side wall and a first frame side wall among the at least one frame side wall and coupling the first metal interconnect to the first IDT; and a second metal conductor disposed on a second cap substrate side wall among the at least one cap substrate side wall and a second frame side wall among the at least one frame side wall and coupling the second metal interconnect to the second IDT.

21. The SAW filter package of any of clauses 13-15, further comprising:

an Aluminum pad disposed on the first surface of the substrate; and wherein:

the cavity frame is coupled to the Aluminum pad to couple the cavity frame to the substrate.

22. The SAW filter package of any of clauses 13-21, wherein the cap substrate comprises a Silicon material.

23. The SAW filter package of any of clauses 13-22 integrated into a device selected from the group consisting of: a set top box; an entertainment unit; a navigation device; a communications device; a fixed location data unit; a mobile location data unit; a global positioning system (GPS) device; a mobile phone; a cellular phone; a smart phone; a session initiation protocol (SIP) phone; a tablet; a phablet; a server; a computer; a portable computer; a mobile computing device; a wearable computing device; a desktop computer; a personal digital assistant (PDA); a monitor; a computer monitor; a television; a tuner; a radio; a satellite radio; a music player; a digital music player; a portable music player; a digital video player; a video player; a digital video disc (DVD) player; a portable digital video player; an automobile; a vehicle component; avionics systems; a drone; and a multicopter.

24. A method of fabricating a surface acoustic wave (SAW) filter package, comprising:

providing a cap substrate comprising a first surface;

coupling a first surface of a cavity frame to the cap substrate, the cavity frame having a thermal conductivity of at least five (5) Watts (W) per meter (m)-Kelvin (W/m-K);

providing a substrate comprising a piezoelectric material, a first surface, a first interdigital transducer (IDT) on the first surface of the substrate, and a second IDT on the first surface of the substrate; and coupling a second surface of the cavity frame to the first surface of the substrate thereby forming a cavity between the cap substrate and the first surface of the substrate and enclosing the first IDT and the second IDT.

25. The method of clause 24, comprising coupling the first surface of the cavity frame to the first surface of the cap substrate before coupling the second surface of the cavity frame to the first surface of the substrate.

26. The method of any of clauses 24 and 25, further comprising forming the cavity frame, comprising:

disposing an etch material layer comprising an etch material on the first surface of the cap substrate;

patterning the etch material layer to form a perimeter opening in the etch material;

disposing a cavity frame material of the cavity frame on the etch material and in the perimeter opening in the etch material; and removing the etch material layer.

27. The method of clause 26, further comprising grinding the cavity frame material to form the second surface of the cavity frame.

28. The method of any of clauses 26 and 27, further comprising dicing the cavity frame coupled to the cap substrate in a vertical direction to form one or more cap substrate side walls of the cap substrate co-planar to one or more frame side walls of the cavity frame.

29. The method of any of clauses 26-28, further comprising forming a first metal interconnect on the first surface of the substrate; and
wherein:
coupling the second surface of the cavity frame to the first surface of the substrate comprises coupling the second surface of the cavity frame to the first metal interconnect on the first surface of the substrate.
30. The method of clause 29, further comprising:
forming a second metal interconnect on a second surface of the cap substrate opposite the first surface of the cap substrate; and
disposing a metal conductor on a cap substrate side wall of the cap substrate and a frame side wall of the cavity frame coupling the first metal interconnect to the second metal interconnect.
31. The method of any of clauses 24-30, wherein the cavity frame comprises a diamond cavity frame.
32. The method any of clauses 24-31, wherein the cavity frame has a coefficient of thermal expansion (CTE) less than or equal to ten (10) parts per million (ppm) per degree Celsius (C) (ppm/deg C.).
33. The method of any of clauses 24-32, wherein the cavity frame has an electrical resistivity greater than or equal to $1 \times 10^{10}$ Ohms centimeter (cm) (Ohms cm).

What is claimed is:
1. A surface acoustic wave (SAW) filter package, comprising:
a substrate comprising a piezoelectric material and having a first surface;
a cap substrate; and
a diamond cavity frame disposed between the substrate and the cap substrate that forms a cavity between the cap substrate and the first surface of the substrate;
a first interdigital transducer (IDT) on the first surface of the substrate inside the cavity;
a second IDT on the first surface of the substrate inside the cavity;
a first metal interconnect coupled to the first surface of the substrate; and
a first metal conductor disposed horizontally on the first metal interconnect and located outside of the cavity.
2. The SAW filter package of claim 1, wherein the cap substrate comprises at least one cap substrate side wall that is co-planar in a vertical direction with at least one frame side wall of the diamond cavity frame.
3. The SAW filter package of claim 1, wherein:
the cap substrate comprises a first cap substrate side wall that extends along a first longitudinal axis and a second cap substrate side wall that extends along a second longitudinal axis parallel to the first longitudinal axis;
the diamond cavity frame comprises a first frame side wall that extends along the first longitudinal axis and a second frame side wall that extends along the second longitudinal axis; and
the first cap substrate side wall is co-planar to the first frame side wall in a vertical direction, and the second cap substrate side wall is co-planar to the second frame side wall in the vertical direction.
4. The SAW filter package of claim 1, wherein:
the cap substrate comprises a rectangular-shaped cap substrate frame perimeter structure;
the diamond cavity frame comprises a rectangular-shaped diamond frame perimeter structure; and
the rectangular-shaped cap substrate frame perimeter structure is co-planar to the rectangular-shaped diamond frame perimeter structure.
5. The SAW filter package of claim 1, wherein the diamond cavity frame has a thermal conductivity between and including 600 and 2,000 Watts (W) per meter (m)-Kelvin (W/m-K).
6. The SAW filter package of claim 1, wherein the diamond cavity frame has a coefficient of thermal expansion (CTE) equal to one (1) part per million (ppm) per degree Celsius (C) (ppm/deg C.) or less.
7. The SAW filter package of claim 1, wherein the diamond cavity frame has an electrical resistivity between and including $1 \times 10^{14}$ and $1 \times 10^{18}$ Ohms centimeter (cm) (Ohms cm).
8. The SAW filter package of claim 2, further comprising:
the first metal interconnect coupled to a first surface of the cap substrate opposite a second surface of the cap substrate;
a second metal interconnect coupled to the first surface of the cap substrate;
a first metal conductor disposed vertically on a first cap substrate side wall among the at least one cap substrate side wall and a first frame side wall among the at least one frame side wall and coupling the first metal interconnect to the first IDT; and
a second metal conductor disposed vertically on a second cap substrate side wall among the at least one cap substrate side wall and a second frame side wall among the at least one frame side wall and coupling the second metal interconnect to the second IDT.
9. The SAW filter package of claim 1, further comprising:
an aluminum pad disposed on the first surface of the substrate; and
wherein:
the diamond cavity frame is coupled to the aluminum pad to couple the diamond cavity frame to the substrate.
10. The SAW filter package of claim 1, wherein the cap substrate comprises a silicon material.
11. The SAW filter package of claim 1, wherein:
the diamond cavity frame comprises a diamond frame perimeter structure comprising a first perimeter surface coupled to the first surface of the substrate and a second perimeter surface; and
the cap substrate comprises a second surface coupled to the second perimeter surface of the diamond frame perimeter structure and enclosing the cavity inside the diamond frame perimeter structure between the substrate and the cap substrate.
12. The SAW filter package of claim 1, integrated into a device selected from the group consisting of: a set top box; an entertainment unit; a navigation device; a communications device; a fixed location data unit; a mobile location data unit; a global positioning system (GPS) device; a mobile phone; a cellular phone; a smart phone; a session initiation protocol (SIP) phone; a tablet; a phablet; a server; a computer; a portable computer; a mobile computing device; a wearable computing device; a desktop computer; a personal digital assistant (PDA); a monitor; a computer monitor; a television; a tuner; a radio; a satellite radio; a music player; a digital music player; a portable music player; a digital video player; a video player; a digital video disc (DVD) player; a portable digital video player; an automobile; a vehicle component; avionics systems; a drone; and a multicopter.

13. A surface acoustic wave (SAW) filter package, comprising:
- a substrate comprising a piezoelectric material and having a first surface;
- a cap substrate;
- a cavity frame having a thermal conductivity of at least five (5) Watts (W) per meter (m)-Kelvin (W/m-K), the cavity frame disposed between the substrate and the cap substrate that forms a cavity between the cap substrate and the first surface of the substrate;
- a first interdigital transducer (IDT) on the first surface of the substrate inside the cavity;
- a second IDT on the first surface of the substrate inside the cavity;
- a first metal interconnect coupled to the first surface of the substrate; and
- a first metal conductor disposed horizontally on the first metal interconnect and located outside the cavity.

14. The SAW filter package of claim 13, wherein the cap substrate comprises at least one cap substrate side wall that is co-planar in a vertical direction with at least one frame side wall of the cavity frame.

15. The SAW filter package of claim 13, wherein:
- the cap substrate comprises a first cap substrate side wall that extends along a first longitudinal axis and a second cap substrate side wall that extends along a second longitudinal axis parallel to the first longitudinal axis;
- the cavity frame comprises a first frame side wall that extends along the first longitudinal axis and a second frame side wall that extends along the second longitudinal axis; and
- the first cap substrate side wall is co-planar to the first frame side wall in a vertical direction, and the second cap substrate side wall is co-planar to the second frame side wall in the vertical direction.

16. The SAW filter package of claim 13, wherein:
- the cap substrate comprises a rectangular-shaped cap substrate frame perimeter structure;
- the cavity frame comprises a rectangular-shaped frame perimeter structure; and
- the rectangular-shaped cap substrate frame perimeter structure is co-planar to the rectangular-shaped frame perimeter structure.

17. The SAW filter package of claim 13, wherein the cavity frame has a coefficient of thermal expansion (CTE) less than or equal to ten (10) parts per million (ppm) per degree Celsius (C) (ppm/deg C.).

18. The SAW filter package of claim 13, wherein the cavity frame has an electrical resistivity greater than or equal to $1 \times 10^{10}$ Ohms centimeter (cm) (Ohms cm).

19. The SAW filter package of claim 13, wherein the cavity frame comprises a material selected from the group consisting of aluminum oxide, silicon nitride, and sapphire.

20. The SAW filter package of claim 14, further comprising:
- the first metal interconnect coupled to a first surface of the cap substrate opposite a second surface of the cap substrate;
- a second metal interconnect coupled to the first surface of the cap substrate;
- a first metal conductor disposed vertically on a first cap substrate side wall among the at least one cap substrate side wall and a first frame side wall among the at least one frame side wall and coupling the first metal interconnect to the first IDT; and
- a second metal conductor disposed vertically on a second cap substrate side wall among the at least one cap substrate side wall and a second frame side wall among the at least one frame side wall and coupling the second metal interconnect to the second IDT.

21. The SAW filter package of claim 13, further comprising:
- an aluminum pad disposed on the first surface of the substrate; and
- wherein:
  - the cavity frame is coupled to the aluminum pad to couple the cavity frame to the substrate.

22. The SAW filter package of claim 13, wherein the cap substrate comprises a silicon material.

23. The SAW filter package of claim 13 integrated into a device selected from the group consisting of: a set top box; an entertainment unit; a navigation device; a communications device; a fixed location data unit; a mobile location data unit; a global positioning system (GPS) device; a mobile phone; a cellular phone; a smart phone; a session initiation protocol (SIP) phone; a tablet; a phablet; a server; a computer; a portable computer; a mobile computing device; a wearable computing device; a desktop computer; a personal digital assistant (PDA); a monitor; a computer monitor; a television; a tuner; a radio; a satellite radio; a music player; a digital music player; a portable music player; a digital video player; a video player; a digital video disc (DVD) player; a portable digital video player; an automobile; a vehicle component; avionics systems; a drone; and a multicopter.

24. A method of fabricating a surface acoustic wave (SAW) filter package, comprising:
- providing a cap substrate comprising a first surface;
- coupling a first surface of a cavity frame to the cap substrate, the cavity frame having a thermal conductivity of at least five (5) Watts (W) per meter (m)-Kelvin (W/m-K);
- providing a substrate comprising a piezoelectric material, a first surface, a first interdigital transducer (IDT) on the first surface of the substrate, and a second IDT on the first surface of the substrate;
- coupling a second surface of the cavity frame to the first surface of the substrate thereby forming a cavity between the cap substrate and the first surface of the substrate and enclosing the first IDT and the second IDT;
- forming a first metal interconnect coupled to the first surface of the substrate; and
- forming a first metal conductor disposed horizontally on the first metal interconnect and located outside the cavity.

25. The method of claim 24, further comprising coupling the first surface of the cavity frame to the first surface of the cap substrate before coupling the second surface of the cavity frame to the first surface of the substrate.

26. The method of claim 24, further comprising forming the cavity frame, comprising:
- disposing an etch material layer comprising an etch material on the first surface of the cap substrate;
- patterning the etch material layer to form a perimeter opening in the etch material;
- disposing a cavity frame material of the cavity frame on the etch material and in the perimeter opening in the etch material; and
- removing the etch material layer.

27. The method of claim 26, further comprising grinding the cavity frame material to form the second surface of the cavity frame.

28. The method of claim 26, further comprising dicing the cavity frame coupled to the cap substrate in a vertical direction to form one or more cap substrate side walls of the cap substrate co-planar to one or more frame side walls of the cavity frame.

29. The method of claim 26,
wherein:
coupling the second surface of the cavity frame to the first surface of the substrate comprises coupling the second surface of the cavity frame to the first metal interconnect on the first surface of the substrate.

30. The method of claim 29, further comprising:
forming a second metal interconnect on a second surface of the cap substrate opposite the first surface of the cap substrate; and
disposing a metal conductor vertically on a cap substrate side wall of the cap substrate and vertically on a frame side wall of the cavity frame coupling the first metal interconnect to the second metal interconnect.

31. The method of claim 24, wherein the cavity frame comprises a diamond cavity frame.

32. The method of claim 24, wherein the cavity frame has a coefficient of thermal expansion (CTE) less than or equal to ten (10) parts per million (ppm) per degree Celsius (C) (ppm/deg C.).

33. The method of claim 24, wherein the cavity frame has an electrical resistivity greater than or equal to $1 \times 10^{10}$ Ohms centimeter (cm) (Ohms cm).

\* \* \* \* \*